United States Patent
Lipton et al.

(10) Patent No.: US 9,425,383 B2
(45) Date of Patent: Aug. 23, 2016

(54) METHOD OF MANUFACTURING ELECTROACTIVE POLYMER TRANSDUCERS FOR SENSORY FEEDBACK APPLICATIONS

(75) Inventors: Michael G. Lipton, Aptos, CA (US);
Ilya Polyakov, San Francisco, CA (US);
Alireza Zarrabi, Santa Clara, CA (US);
Otto Hui, Burlingame, CA (US); Silmon James Biggs, Los Gatos, CA (US);
Thomas A. Kridl, Los Altos, CA (US);
Gordon Russell, Redwood City, CA (US); Jonathan R. Heim, Pacifica, CA (US); Roger Hitchcock, San Leandro, CA (US); Chris A. Weaber, Montara, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 1115 days.

(21) Appl. No.: 13/205,888

(22) Filed: Aug. 9, 2011

(65) Prior Publication Data

US 2011/0285247 A1 Nov. 24, 2011

Related U.S. Application Data

(60) Division of application No. 13/069,908, filed on Mar. 23, 2011, now Pat. No. 8,319,403, which is a division of application No. 12/766,771, filed on Apr. 23, 2010, now Pat. No. 8,127,437, which is a continuation of (Continued)

(51) Int. Cl.
*H01L 41/09* (2006.01)
*G06F 3/01* (2006.01)

(Continued)

(52) U.S. Cl.
CPC .......... *H01L 41/0986* (2013.01); *G01R 33/28* (2013.01); *G06F 3/016* (2013.01);

(Continued)

(58) Field of Classification Search
CPC ............ H01H 13/84; H01H 2217/018; H01H 2203/008; H01H 2003/008; G06F 3/016; H01L 41/19; H01L 41/0986; H01L 41/0933; H01L 41/113; H01L 41/1132; H01L 41/1138; H01L 41/18; Y10S 310/80; Y10T 29/42; Y10T 29/49005; Y10T 29/49126; Y10T 29/49128; Y10T 29/49147; Y10T 29/49155; Y10T 29/49165; Y10T 29/49121; Y10T 29/4913; Y10T 29/4902; Y10T 29/49117; G01R 33/28
USPC ........ 29/25.35, 584, 830, 831, 842, 846, 594; 310/328, 339, 800; 318/116
See application file for complete search history.

(56) References Cited

U.S. PATENT DOCUMENTS 2,430,013 A 11/1947 Hansell
2,967,914 A 1/1961 Pye (Continued)

FOREIGN PATENT DOCUMENTS

CA 2329804 A1 11/1999
CA 2330384 A1 11/1999

(Continued)

OTHER PUBLICATIONS

Todorov et al, "WWWeb Application for Ferropiezoelectric Ceramic Parameters Calculation", Proceedings 24$^{th}$ International Conference on Microelectronics, vol. 1, May 2004, pp. 507-510.*

(Continued)

*Primary Examiner* — A. Dexter Tugbang
(74) *Attorney, Agent, or Firm* — K&L Gates LLP

(57) ABSTRACT

A method for fabricating electroactive polymer transducers, the includes providing an electroactive polymer film comprising an elastomeric dielectric polymer, forming an array of electrodes on the film, and sandwiching the electrode array between a top and bottom array of frame components to form an array of electroactive polymer transducers.

19 Claims, 17 Drawing Sheets

Related U.S. Application Data application No. 12/163,554, filed on Jun. 27, 2008, now Pat. No. 7,952,261.

(60) Provisional application No. 60/937,787, filed on Jun. 29, 2007.

(51) Int. Cl.
    *H01L 41/18*     (2006.01)
    *H01L 41/113*     (2006.01)
    *G01R 33/28*     (2006.01)
    *H01H 13/84*     (2006.01)
    *H01H 3/00*     (2006.01)

(52) U.S. Cl.
    CPC .......... *H01H 13/84* (2013.01); *H01L 41/0933* (2013.01); *H01L 41/113* (2013.01); *H01L 41/1132* (2013.01); *H01L 41/1138* (2013.01); *H01L 41/18* (2013.01); *H01H 2003/008* (2013.01); *H01H 2203/008* (2013.01); *H01H 2217/018* (2013.01); *Y10S 310/80* (2013.01); *Y10T 29/42* (2015.01); *Y10T 29/4902* (2015.01); *Y10T 29/49005* (2015.01); *Y10T 29/4913* (2015.01); *Y10T 29/49117* (2015.01); *Y10T 29/49121* (2015.01); *Y10T 29/49126* (2015.01); *Y10T 29/49128* (2015.01); *Y10T 29/49147* (2015.01); *Y10T 29/49155* (2015.01); *Y10T 29/49165* (2015.01)

(56) References Cited

U.S. PATENT DOCUMENTS

| | | |
|---|---|---|
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,516,846 A | 6/1970 | Matson |
| 3,539,841 A | 11/1970 | Riff |
| 3,558,936 A | 1/1971 | Horan |
| 3,606,241 A | 9/1971 | Bornholdt |
| 3,699,963 A | 10/1972 | Zaffaroni |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A * | 2/1976 | Ohigashi et al. ...... Y10S 310/80 |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A * | 11/1980 | Iguchi et al. .............. 310/339 X |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,566,135 A | 1/1986 | Schmidt |
| 4,588,998 A | 5/1986 | Yamamuro et al. |
| 4,592,383 A | 6/1986 | Rikuta |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,668,449 A | 5/1987 | Soni et al. |
| 4,678,955 A | 7/1987 | Toda |
| 4,686,440 A | 8/1987 | Hatamura et al. |
| 4,689,614 A | 8/1987 | Strachan |
| 4,704,556 A | 11/1987 | Kay |
| 4,715,396 A | 12/1987 | Fox |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |
| 4,885,830 A | 12/1989 | Ohtaka |
| 4,904,222 A | 2/1990 | Gastgeb et al. |
| 4,906,886 A | 3/1990 | Breimesser et al. |

(56) References Cited

U.S. PATENT DOCUMENTS

| | | |
|---|---|---|
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,048,791 A | 9/1991 | Ellison et al. |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,199,641 A | 4/1993 | Hohm et al. |
| 5,206,557 A | 4/1993 | Bobbio |
| 5,229,979 A | 7/1993 | Scheinbeim et al. |
| 5,232,196 A | 8/1993 | Hutchings et al. |
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim et al. |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Bushulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,632,841 A | 5/1997 | Hellbaum et al. |
| 5,636,072 A | 6/1997 | Shibata et al. |
| 5,636,100 A | 6/1997 | Zheng et al. |
| 5,642,015 A | 6/1997 | Whitehead et al. |
| 5,647,245 A | 7/1997 | Takei |
| 5,668,703 A | 9/1997 | Rossi et al. |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aeroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,040,356 A | 3/2000 | Kanki et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |

(56) References Cited

U.S. PATENT DOCUMENTS

| | | | |
|---|---|---|---|
| 6,156,842 A | 12/2000 | Hoenig et al. | |
| 6,157,528 A | 12/2000 | Anthony | |
| 6,161,966 A | 12/2000 | Chang et al. | |
| 6,165,126 A | 12/2000 | Merzenich et al. | |
| 6,168,133 B1 | 1/2001 | Heinz et al. | |
| 6,181,351 B1 | 1/2001 | Merrill et al. | |
| 6,184,044 B1 | 2/2001 | Sone et al. | |
| 6,184,608 B1 | 2/2001 | Cabuz et al. | |
| 6,184,609 B1 | 2/2001 | Johansson et al. | |
| 6,184,844 B1 | 2/2001 | Filipovic et al. | |
| 6,190,805 B1 | 2/2001 | Takeuchi et al. | |
| 6,194,815 B1 | 2/2001 | Carroll | |
| 6,196,935 B1 | 3/2001 | Spangler et al. | |
| 6,198,203 B1 | 3/2001 | Hotomi | |
| 6,198,204 B1 | 3/2001 | Pottenger | |
| 6,201,398 B1 | 3/2001 | Takada | |
| 6,210,827 B1 | 4/2001 | Dopp et al. | |
| 6,228,533 B1 | 5/2001 | Ohashi et al. | |
| 6,232,702 B1 | 5/2001 | Newnham et al. | |
| 6,239,535 B1 | 5/2001 | Toda et al. | |
| 6,239,536 B1 | 5/2001 | Lakin | |
| 6,240,814 B1 | 6/2001 | Boyd et al. | |
| 6,248,262 B1 | 6/2001 | Kubotera et al. | |
| 6,249,076 B1 | 6/2001 | Madden et al. | |
| 6,252,221 B1 | 6/2001 | Kaneko et al. | |
| 6,252,334 B1 | 6/2001 | Nye et al. | |
| 6,252,336 B1 | 6/2001 | Hall | |
| 6,255,758 B1 | 7/2001 | Cabuz et al. | |
| 6,262,516 B1 | 7/2001 | Fukuda et al. | |
| 6,268,219 B1 | 7/2001 | McBride et al. | |
| 6,282,074 B1 | 8/2001 | Anthony | |
| 6,284,435 B1 | 9/2001 | Cao | |
| 6,286,961 B1 | 9/2001 | Ogawa | |
| 6,291,155 B1 | 9/2001 | Raguse et al. | |
| 6,291,928 B1 | 9/2001 | Lazarus et al. | |
| 6,294,859 B1 | 9/2001 | Jaenker | |
| 6,297,579 B1 | 10/2001 | Martin et al. | |
| 6,311,950 B1 | 11/2001 | Kappel et al. | |
| 6,316,084 B1 | 11/2001 | Claus et al. | |
| 6,321,428 B1 | 11/2001 | Toda et al. | |
| 6,330,463 B1 | 12/2001 | Hedrich | |
| 6,333,595 B1 | 12/2001 | Horikawa et al. | |
| 6,334,673 B1 | 1/2002 | Kitahara et al. | |
| 6,336,367 B1 | 1/2002 | Raeisaenen | |
| 6,336,880 B1 | 1/2002 | Agner | |
| 6,339,527 B1 | 1/2002 | Farooq et al. | |
| 6,343,129 B1 | 1/2002 | Pelrine et al. | |
| 6,345,840 B1 | 2/2002 | Meyer et al. | |
| 6,349,141 B1 | 2/2002 | Corsaro | |
| 6,355,185 B1 | 3/2002 | Kubota | |
| 6,358,021 B1 | 3/2002 | Cabuz | |
| 6,359,370 B1 | 3/2002 | Chang | |
| 6,366,193 B2 | 4/2002 | Duggal et al. | |
| 6,369,954 B1 | 4/2002 | Berge et al. | |
| 6,375,857 B1 | 4/2002 | Ng et al. | |
| 6,376,971 B1 | 4/2002 | Pelrine et al. | |
| 6,377,383 B1 | 4/2002 | Whitehead et al. | |
| 6,379,393 B1 | 4/2002 | Mavroidis et al. | |
| 6,379,809 B1 | 4/2002 | Simpson et al. | |
| 6,385,021 B1 | 5/2002 | Takeda et al. | |
| 6,385,429 B1 | 5/2002 | Weber et al. | |
| 6,388,043 B1 | 5/2002 | Langer et al. | |
| 6,388,553 B1 | 5/2002 | Shea et al. | |
| 6,388,856 B1 | 5/2002 | Anthony | |
| 6,400,065 B1 | 6/2002 | Toda et al. | |
| 6,404,107 B1 * | 6/2002 | Lazarus et al. ............... 310/328 | |
| 6,411,009 B2 | 6/2002 | Jaenker | |
| 6,411,013 B1 | 6/2002 | Horning | |
| 6,424,079 B1 | 7/2002 | Carroll | |
| 6,429,573 B2 | 8/2002 | Koopmann et al. | |
| 6,429,576 B1 | 8/2002 | Simes | |
| 6,433,689 B1 | 8/2002 | Hovind et al. | |
| 6,434,245 B1 | 8/2002 | Zimmermann | |
| 6,435,840 B1 | 8/2002 | Sharma et al. | |
| 6,436,531 B1 | 8/2002 | Kollaja et al. | |
| 6,437,489 B1 | 8/2002 | Shinke et al. | |
| 6,457,697 B1 | 10/2002 | Kolze | |
| 6,459,088 B1 | 10/2002 | Yasuda et al. | |
| 6,471,185 B2 | 10/2002 | Lewin et al. | |
| 6,475,931 B2 | 11/2002 | Bower et al. | |
| 6,486,589 B1 | 11/2002 | Dujari et al. | |
| 6,492,762 B1 | 12/2002 | Pant et al. | |
| 6,495,945 B2 | 12/2002 | Yamaguchi et al. | |
| 6,499,509 B2 | 12/2002 | Berger et al. | |
| 6,502,803 B1 | 1/2003 | Mattes | |
| 6,504,286 B1 | 1/2003 | Porat et al. | |
| 6,509,802 B2 | 1/2003 | Kasperkovitz | |
| 6,514,237 B1 | 2/2003 | Maseda | |
| 6,522,516 B2 | 2/2003 | Anthony | |
| 6,523,560 B1 | 2/2003 | Williams et al. | |
| 6,528,925 B1 | 3/2003 | Takeuchi et al. | |
| 6,528,928 B1 | 3/2003 | Burns et al. | |
| 6,530,266 B1 | 3/2003 | Adderton et al. | |
| 6,532,145 B1 | 3/2003 | Carlen et al. | |
| 6,540,893 B1 | 4/2003 | Wakida et al. | |
| 6,543,110 B1 | 4/2003 | Pelrine et al. | |
| 6,545,384 B1 | 4/2003 | Pelrine et al. | |
| 6,562,513 B1 | 5/2003 | Takeuchi et al. | |
| 6,583,533 B2 | 6/2003 | Pelrine et al. | |
| 6,586,859 B2 | 7/2003 | Kornbluh et al. | |
| 6,590,267 B1 | 7/2003 | Goodwin-Johansson et al. | |
| 6,593,155 B2 | 7/2003 | Mohler et al. | |
| 6,613,816 B2 | 9/2003 | Mahdi et al. | |
| 6,617,759 B1 | 9/2003 | Zumeris et al. | |
| 6,617,765 B1 | 9/2003 | Lagier et al. | |
| 6,619,799 B1 | 9/2003 | Blum et al. | |
| 6,628,040 B2 | 9/2003 | Pelrine et al. | |
| 6,631,068 B1 | 10/2003 | Lobo | |
| 6,637,276 B2 | 10/2003 | Adderton et al. | |
| 6,640,402 B1 | 11/2003 | Vooren et al. | |
| 6,644,027 B1 | 11/2003 | Kelly | |
| 6,646,077 B1 | 11/2003 | Lyons | |
| 6,650,455 B2 | 11/2003 | Miles | |
| 6,652,938 B1 | 11/2003 | Nishikawa et al. | |
| 6,664,718 B2 | 12/2003 | Pelrine et al. | |
| 6,668,109 B2 | 12/2003 | Nahum et al. | |
| 6,673,533 B1 | 1/2004 | Wohlstadter et al. | |
| 6,680,825 B1 | 1/2004 | Murphy et al. | |
| 6,682,500 B2 | 1/2004 | Soltanpour et al. | |
| 6,690,101 B2 | 2/2004 | Magnussen et al. | |
| 6,700,314 B2 | 3/2004 | Cuhat et al. | |
| 6,701,296 B1 | 3/2004 | Kramer et al. | |
| 6,707,236 B2 | 3/2004 | Pelrine et al. | |
| 6,720,710 B1 | 4/2004 | Wenzel et al. | |
| 6,733,130 B2 | 5/2004 | Blum et al. | |
| 6,743,273 B2 | 6/2004 | Chung et al. | |
| 6,762,050 B2 | 7/2004 | Fukushima et al. | |
| 6,781,284 B1 | 8/2004 | Pelrine et al. | |
| 6,784,227 B2 | 8/2004 | Simon et al. | |
| 6,791,205 B2 | 9/2004 | Woodbridge | |
| 6,796,639 B2 | 9/2004 | Sugahara | |
| 6,800,155 B2 | 10/2004 | Senecal et al. | |
| 6,804,068 B2 | 10/2004 | Sasaki et al. | |
| 6,806,621 B2 | 10/2004 | Heim et al. | |
| 6,806,806 B2 | 10/2004 | Anthony | |
| 6,806,808 B1 | 10/2004 | Watters et al. | |
| 6,809,462 B2 | 10/2004 | Pelrine et al. | |
| 6,809,928 B2 | 10/2004 | Gwin et al. | |
| 6,812,624 B1 | 11/2004 | Pei et al. | |
| 6,824,689 B2 | 11/2004 | Wang et al. | |
| 6,847,153 B1 | 1/2005 | Balizer | |
| 6,847,155 B2 | 1/2005 | Schwartz et al. | |
| 6,856,305 B2 | 2/2005 | Nagano | |
| 6,864,592 B1 | 3/2005 | Kelly | |
| 6,866,242 B2 | 3/2005 | Hirota | |
| 6,867,533 B1 | 3/2005 | Su et al. | |
| 6,869,275 B2 | 3/2005 | Dante et al. | |
| 6,876,125 B2 | 4/2005 | Basheer et al. | |
| 6,876,135 B2 | 4/2005 | Pelrine et al. | |
| 6,879,318 B1 | 4/2005 | Chan et al. | |
| 6,882,086 B2 | 4/2005 | Kornbluh et al. | |
| 6,891,317 B2 | 5/2005 | Pei et al. | |
| 6,902,048 B1 | 6/2005 | Chung | |
| 6,911,764 B2 | 6/2005 | Pelrine et al. | |

(56) References Cited

U.S. PATENT DOCUMENTS

| | | | |
|---|---|---|---|
| 6,935,287 | B2 | 8/2005 | Shinogle |
| 6,938,945 | B2 | 9/2005 | Wald et al. |
| 6,940,211 | B2 | 9/2005 | Pelrine et al. |
| 6,940,212 | B2 | 9/2005 | Mueller |
| 6,940,221 | B2 | 9/2005 | Matsukiyo et al. |
| 6,944,931 | B2 | 9/2005 | Shcheglov et al. |
| 6,952,313 | B2 | 10/2005 | Schrader |
| 6,967,430 | B2 | 11/2005 | Johansson |
| 6,994,314 | B2 | 2/2006 | Garnier et al. |
| 6,997,870 | B2 | 2/2006 | Couvillon, Jr. |
| 7,008,838 | B1 | 3/2006 | Hosking et al. |
| 7,011,378 | B2 | 3/2006 | Maluf et al. |
| 7,011,760 | B2 | 3/2006 | Wang et al. |
| 7,029,056 | B2 | 4/2006 | Browne et al. |
| 7,034,432 | B1 | 4/2006 | Pelrine et al. |
| 7,037,270 | B2 | 5/2006 | Seward |
| 7,038,357 | B2 | 5/2006 | Goldenberg et al. |
| 7,049,732 | B2 | 5/2006 | Pei et al. |
| 7,052,594 | B2 | 5/2006 | Pelrine et al. |
| 7,062,055 | B2 | 6/2006 | Pelrine et al. |
| 7,063,268 | B2 | 6/2006 | Chrysler et al. |
| 7,063,377 | B2 | 6/2006 | Brei et al. |
| 7,064,472 | B2 | 6/2006 | Pelrine et al. |
| 7,071,596 | B2 | 7/2006 | Krill |
| 7,075,162 | B2 | 7/2006 | Unger |
| 7,075,213 | B2 | 7/2006 | Krill |
| 7,092,238 | B2 | 8/2006 | Saito et al. |
| 7,099,141 | B1 | 8/2006 | Kaufman et al. |
| 7,104,146 | B2 | 9/2006 | Benslimane et al. |
| 7,109,643 | B2 | 9/2006 | Hirai et al. |
| 7,113,318 | B2 | 9/2006 | Onuki et al. |
| 7,113,848 | B2 | 9/2006 | Hanson |
| 7,115,092 | B2 | 10/2006 | Park et al. |
| 7,140,180 | B2 | 11/2006 | Gerber et al. |
| 7,141,888 | B2 | 11/2006 | Sabol et al. |
| 7,142,368 | B2 | 11/2006 | Kim et al. |
| 7,142,369 | B2 | 11/2006 | Wu et al. |
| 7,144,616 | B1 | 12/2006 | Unger et al. |
| 7,148,789 | B2 | 12/2006 | Sadler et al. |
| 7,164,212 | B2 | 1/2007 | Leijon et al. |
| 7,166,952 | B2 | 1/2007 | Topliss et al. |
| 7,166,953 | B2 | 1/2007 | Heim et al. |
| 7,170,665 | B2 | 1/2007 | Kaneko et al. |
| 7,190,016 | B2 | 3/2007 | Cahalen et al. |
| 7,193,350 | B1 | 3/2007 | Blackburn et al. |
| 7,195,393 | B2 | 3/2007 | Potter |
| 7,195,950 | B2 | 3/2007 | Taussig |
| 7,196,688 | B2 | 3/2007 | Schena |
| 7,199,302 | B2 | 4/2007 | Raisanen |
| 7,199,501 | B2 | 4/2007 | Pei et al. |
| 7,205,704 | B2 | 4/2007 | Audren et al. |
| 7,205,978 | B2 | 4/2007 | Poupyrev et al. |
| 7,209,280 | B2 | 4/2007 | Goossens |
| 7,211,937 | B2 | 5/2007 | Kornbluh et al. |
| 7,220,785 | B2 | 5/2007 | Saito |
| 7,224,106 | B2 | 5/2007 | Pei et al. |
| 7,235,152 | B2 | 6/2007 | Bell et al. |
| 7,237,524 | B2 | 7/2007 | Pelrine et al. |
| 7,242,106 | B2 | 7/2007 | Kelly |
| 7,242,141 | B2 | 7/2007 | Pschenitzka et al. |
| 7,245,440 | B2 | 7/2007 | Peseux |
| 7,256,943 | B1 | 8/2007 | Kobrin et al. |
| 7,259,495 | B2 | 8/2007 | Asai et al. |
| 7,259,503 | B2 | 8/2007 | Pei et al. |
| 7,276,090 | B2 | 10/2007 | Shahinpoor et al. |
| 7,291,512 | B2 | 11/2007 | Unger |
| 7,298,054 | B2 | 11/2007 | Hirsch |
| 7,298,559 | B2 | 11/2007 | Kato et al. |
| 7,298,603 | B2 | 11/2007 | Mizuno et al. |
| 7,301,261 | B2 | 11/2007 | Ifuku et al. |
| 7,310,874 | B2 | 12/2007 | Higuchi et al. |
| 7,312,917 | B2 | 12/2007 | Jacob |
| 7,316,794 | B2 | 1/2008 | O/Brien |
| 7,320,457 | B2 | 1/2008 | Heim et al. |
| 7,321,185 | B2 | 1/2008 | Schultz |
| 7,323,790 | B2 | 1/2008 | Taylor et al. |
| 7,332,688 | B2 | 2/2008 | Browne et al. |
| 7,339,285 | B2 | 3/2008 | Negron Crespo |
| 7,339,572 | B2 | 3/2008 | Schena |
| 7,342,573 | B2 | 3/2008 | Ryynanen |
| 7,344,763 | B2 | 3/2008 | Kokeguchi et al. |
| 7,355,293 | B2 | 4/2008 | Bernhoff et al. |
| 7,359,124 | B1 | 4/2008 | Fang et al. |
| 7,362,031 | B2 | 4/2008 | Maita et al. |
| 7,362,032 | B2 | 4/2008 | Pelrine et al. |
| 7,362,889 | B2 | 4/2008 | Dubowsky et al. |
| 7,368,862 | B2 | 5/2008 | Pelrine et al. |
| 7,371,596 | B2 | 5/2008 | Warner, Jr. et al. |
| 7,373,454 | B1 | 5/2008 | Noe |
| 7,378,783 | B2 | 5/2008 | Pelrine et al. |
| 7,392,876 | B2 | 7/2008 | Browne et al. |
| 7,394,182 | B2 | 7/2008 | Pelrine et al. |
| 7,394,282 | B2 | 7/2008 | Sinha et al. |
| 7,394,641 | B2 | 7/2008 | Won et al. |
| 7,397,166 | B1 | 7/2008 | Morgan et al. |
| 7,401,846 | B2 | 7/2008 | Browne et al. |
| 7,411,332 | B2 | 8/2008 | Kornbluh et al. |
| 7,426,340 | B2 | 9/2008 | Seo |
| 7,429,074 | B2 | 9/2008 | McKnight et al. |
| 7,429,495 | B2 | 9/2008 | Wan |
| 7,436,099 | B2 | 10/2008 | Pei et al. |
| 7,436,646 | B2 | 10/2008 | Delince et al. |
| 7,442,421 | B2 | 10/2008 | Li et al. |
| 7,442,760 | B2 | 10/2008 | Roberts et al. |
| 7,444,072 | B2 | 10/2008 | Seo |
| 7,446,926 | B2 | 11/2008 | Sampsell |
| 7,449,821 | B2 | 11/2008 | Dausch |
| 7,454,820 | B2 | 11/2008 | Nakamura |
| 7,456,549 | B2 | 11/2008 | Heim et al. |
| 7,468,575 | B2 | 12/2008 | Pelrine et al. |
| 7,481,120 | B2 | 1/2009 | Gravesen et al. |
| 7,482,745 | B2 | 1/2009 | Shirogane et al. |
| 7,492,076 | B2 | 2/2009 | Heim et al. |
| 7,498,729 | B2 | 3/2009 | Ogino |
| 7,499,223 | B2 | 3/2009 | Berge et al. |
| 7,511,706 | B2 | 3/2009 | Schena |
| 7,513,624 | B2 | 4/2009 | Yavid et al. |
| 7,515,350 | B2 | 4/2009 | Berge et al. |
| 7,518,284 | B2 | 4/2009 | Benslimane et al. |
| 7,521,847 | B2 | 4/2009 | Heim |
| 7,537,197 | B2 | 5/2009 | Heim et al. |
| 7,548,015 | B2 | 6/2009 | Benslimane et al. |
| 7,548,232 | B2 | 6/2009 | Shahoian et al. |
| 7,567,681 | B2 | 7/2009 | Pelrine et al. |
| 7,573,064 | B2 | 8/2009 | Benslimane et al. |
| 7,585,122 | B2 | 9/2009 | Eromaki et al. |
| 7,586,242 | B2 | 9/2009 | Yokoyama et al. |
| 7,595,580 | B2 | 9/2009 | Heim |
| 7,608,989 | B2 | 10/2009 | Heydt et al. |
| 7,626,319 | B2 | 12/2009 | Heim |
| 7,646,544 | B2 | 1/2010 | Batchko et al. |
| 7,648,118 | B2 | 1/2010 | Ukpai et al. |
| 7,659,918 | B2 | 2/2010 | Turner |
| 7,679,267 | B2 | 3/2010 | Heim |
| 7,679,839 | B2 | 3/2010 | Polyakov et al. |
| 7,690,622 | B2 | 4/2010 | Ito et al. |
| 7,702,227 | B2 | 4/2010 | Ito et al. |
| 7,703,740 | B1 | 4/2010 | Franklin |
| 7,703,742 | B2 | 4/2010 | Heim et al. |
| 7,703,839 | B2 | 4/2010 | McKnight et al. |
| 7,705,521 | B2 | 4/2010 | Pelrine et al. |
| 7,714,701 | B2 | 5/2010 | Altan et al. |
| 7,732,999 | B2 | 6/2010 | Clausen et al. |
| 7,733,575 | B2 | 6/2010 | Heim et al. |
| 7,745,374 | B2 | 6/2010 | Tanaka et al. |
| 7,750,532 | B2 | 7/2010 | Heim |
| 7,750,617 | B2 | 7/2010 | Omi |
| 7,761,981 | B2 | 7/2010 | Rosenthal et al. |
| 7,772,745 | B2 | 8/2010 | Kawakubo et al. |
| 7,785,656 | B2 | 8/2010 | Pei et al. |
| 7,787,646 | B2 | 8/2010 | Pelrine et al. |
| 7,813,047 | B2 | 10/2010 | Wang et al. |
| 7,824,580 | B2 | 11/2010 | Boll et al. |
| 7,886,993 | B2 | 2/2011 | Bachmaier et al. |

(56) References Cited

U.S. PATENT DOCUMENTS

| | | | |
|---|---|---|---|
| 7,893,965 B2 | 2/2011 | Heim et al. |
| 7,898,159 B2 | 3/2011 | Heydt et al. |
| 7,911,115 B2 | 3/2011 | Pelrine et al. |
| 7,911,761 B2 | 3/2011 | Biggs et al. |
| 7,915,789 B2 | 3/2011 | Smith |
| 7,915,790 B2 | 3/2011 | Heim et al. |
| 7,921,541 B2 | 4/2011 | Pei et al. |
| 7,923,064 B2 | 4/2011 | Pelrine et al. |
| 7,923,902 B2 | 4/2011 | Heim |
| 7,923,982 B2 | 4/2011 | Sumita |
| 7,940,476 B2 | 5/2011 | Polyakov et al. |
| 7,952,261 B2 | 5/2011 | Lipton et al. |
| 7,958,789 B2 | 6/2011 | Hayakawa et al. |
| 7,971,850 B2 | 7/2011 | Heim et al. |
| 7,980,671 B2 | 7/2011 | Nystrom et al. |
| 7,986,466 B2 | 7/2011 | Lee et al. |
| 7,990,022 B2 | 8/2011 | Heim |
| 7,997,260 B2 | 8/2011 | Kaakkola et al. |
| 8,004,339 B2 | 8/2011 | Barrow |
| 8,007,986 B2 | 8/2011 | Zhang et al. |
| 8,026,023 B2 | 9/2011 | Hamada |
| 8,033,324 B2 | 10/2011 | Mukasa et al. |
| 8,042,264 B2 | 10/2011 | Rosenthal et al. |
| 8,049,333 B2 | 11/2011 | Alden et al. |
| 8,050,601 B2 | 11/2011 | Lin et al. |
| 8,054,566 B2 | 11/2011 | Heim et al. |
| 8,058,861 B2 | 11/2011 | Pelrine et al. |
| 8,072,121 B2 | 12/2011 | Heim et al. |
| 8,074,939 B2 | 12/2011 | Hyde et al. |
| 8,093,783 B2 | 1/2012 | Rosenthal et al. |
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,211,054 B2 | 7/2012 | Dewey |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma et al. |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Pelrine et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,679,575 B2 | 3/2014 | Biggs et al. |
| 8,679,621 B2 | 3/2014 | Blaiszik et al. |
| 8,773,373 B2 | 7/2014 | Sato et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 2001/0007449 A1 | 7/2001 | Kobachi et al. |
| 2001/0035723 A1* | 11/2001 | Pelrine et al. ............ 318/116 |
| 2002/0054060 A1* | 5/2002 | Schena ............... G06F 3/016 715/701 |
| 2002/0083858 A1 | 7/2002 | MacDiarmid et al. |
| 2003/0210811 A1* | 11/2003 | Dubowsky ............ G01R 33/28 382/128 |
| 2004/0014860 A1 | 1/2004 | Meier et al. |
| 2004/0046739 A1 | 3/2004 | Gettemy |
| 2004/0124738 A1 | 7/2004 | Pelrine et al. |
| 2005/0002113 A1 | 1/2005 | Berge |
| 2005/0046312 A1 | 3/2005 | Miyoshi |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0157893 A1* | 7/2005 | Pelrine ............... H01L 41/0986 381/190 |
| 2005/0200984 A1 | 9/2005 | Browne et al. |
| 2006/0057377 A1 | 3/2006 | Harrison et al. |
| 2006/0079619 A1 | 4/2006 | Wang et al. |
| 2006/0108416 A1 | 5/2006 | Hirai |
| 2006/0122954 A1 | 6/2006 | Podlasek et al. |
| 2006/0138371 A1 | 6/2006 | Garnier |
| 2006/0163725 A1 | 7/2006 | Haba et al. |
| 2006/0197741 A1 | 9/2006 | Biggadike |
| 2006/0208610 A1 | 9/2006 | Heim |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita et al. |
| 2007/0200457 A1 | 8/2007 | Heim et al. |
| 2007/0219285 A1 | 9/2007 | Kropp et al. |
| 2007/0230222 A1 | 10/2007 | Drabing et al. |
| 2008/0043318 A1 | 2/2008 | Whitesides et al. |
| 2008/0062589 A1 | 3/2008 | Drabing |
| 2008/0143696 A1 | 6/2008 | Goulthorpe |
| 2008/0152921 A1 | 6/2008 | Kropp |
| 2008/0191832 A1 | 8/2008 | Tsai |
| 2008/0303782 A1 | 12/2008 | Grant et al. |
| 2009/0028491 A1 | 1/2009 | Fillion et al. |
| 2009/0104448 A1 | 4/2009 | Thompson et al. |
| 2009/0184606 A1 | 7/2009 | Rosenthal et al. |
| 2009/0250021 A1 | 10/2009 | Zarrabi et al. |
| 2009/0297829 A1 | 12/2009 | Pyles et al. |
| 2010/0006827 A1 | 1/2010 | Buckley |
| 2010/0236843 A1 | 9/2010 | Englund |
| 2010/0265031 A1 | 10/2010 | Yen |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0256383 A1 | 10/2011 | Cochet et al. |
| 2012/0128960 A1 | 5/2012 | Büsgen |
| 2014/0014715 A1 | 1/2014 | Moran et al. |
| 2014/0176753 A1 | 6/2014 | Hillis et al. |
| 2014/0290834 A1 | 10/2014 | Egron et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0034237 A1 | 2/2015 | Biggs et al. |
| 2015/0043095 A1 | 2/2015 | Lipton et al. |
| 2015/0070740 A1 | 3/2015 | Zarrabi et al. |
| 2015/0084483 A1 | 3/2015 | Yoo et al. |
| 2015/0096666 A1 | 4/2015 | Yoo et al. |
| 2015/0221851 A1 | 8/2015 | Biggs et al. |
| 2015/0221852 A1 | 8/2015 | Biggs et al. |
| 2015/0221861 A1 | 8/2015 | Biggs et al. |
| 2015/0231802 A1 | 8/2015 | Quan et al. |
| 2015/0270791 A1 | 9/2015 | Sutherland et al. |
| 2016/0025429 A1 | 1/2016 | Muir et al. |

FOREIGN PATENT DOCUMENTS

| | | | |
|---|---|---|---|
| CA | 2769441 A1 | 2/2011 |
| CN | 1447365 A | 10/2003 |
| DE | 2535833 A1 | 2/1977 |
| DE | 4408618 A1 | 9/1995 |
| DE | 19636909 C1 | 3/1998 |
| DE | 19952062 A1 | 5/2000 |
| DE | 10058096 A1 | 6/2002 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0154473 B1 | 5/1992 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |

(56) References Cited

FOREIGN PATENT DOCUMENTS

| | | |
|---|---|---|
| EP | 1323925 A2 | 7/2004 |
| EP | 1528609 A2 | 5/2005 |
| EP | 1698876 A2 | 9/2006 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2208461 A5 | 6/1974 |
| FR | 2745476 A1 | 9/1997 |
| GB | 2338513 A | 12/1999 |
| GB | 2470006 A | 11/2010 |
| JP | S 5181120 A | 7/1976 |
| JP | S 52120840 A | 10/1977 |
| JP | S 5445593 A | 4/1979 |
| JP | S 5542474 A | 3/1980 |
| JP | S 5565569 A | 5/1980 |
| JP | S 5661679 A | 5/1981 |
| JP | S 59126689 A | 7/1984 |
| JP | S 6199499 A | 5/1986 |
| JP | S 61239799 A | 10/1986 |
| JP | S 6397100 A | 4/1988 |
| JP | 02222019 | 2/1989 |
| JP | H 02162214 A | 6/1990 |
| JP | 03173022 A | 7/1991 |
| JP | 05244782 A * | 9/1993 ............... 29/25.35 X |
| JP | H 07111785 A | 4/1995 |
| JP | H 07240544 A | 9/1995 |
| JP | 11134109 | 10/1997 |
| JP | H 09275688 A | 10/1997 |
| JP | H 10137655 A | 5/1998 |
| JP | H 10321482 A | 12/1998 |
| JP | H 112764 A | 1/1999 |
| JP | H 11133210 A | 5/1999 |
| JP | 2000-081504 A | 3/2000 |
| JP | 2000-331874 A | 11/2000 |
| JP | 2001-130774 A | 5/2001 |
| JP | 2001-136598 A | 5/2001 |
| JP | 2001-286162 A | 10/2001 |
| JP | 2001-291906 A | 10/2001 |
| JP | 2003-040041 A | 2/2003 |
| JP | 3501216 B2 | 3/2004 |
| JP | 2004-516966 A | 6/2004 |
| JP | 2004-205827 A | 7/2004 |
| JP | 2004-221742 A | 8/2004 |
| JP | 2004-296154 A | 10/2004 |
| JP | 2004-353279 A | 12/2004 |
| JP | 2005-001885 A | 1/2005 |
| JP | 2005-202707 A | 7/2005 |
| JP | 3709723 B2 | 8/2005 |
| JP | 2005-260236 A | 9/2005 |
| JP | 2006-509052 A | 3/2006 |
| JP | 2006-178434 A | 7/2006 |
| JP | 200624490 A | 9/2006 |
| JP | 2007-206362 A | 8/2007 |
| JP | 2007-287670 A | 11/2007 |
| JP | 2008-262955 A | 10/2008 |
| JP | 2008-277729 A | 11/2008 |
| JP | 2009-077618 A | 4/2009 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 A | 11/2011 |
| TW | I1269615 B | 12/2006 |
| TW | I272194 B | 2/2007 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A2 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/37660 A1 | 5/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | WO 2005/079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |
| WO | WO 2006/121818 A2 | 11/2006 |
| WO | WO 2006/123317 A2 | 11/2006 |
| WO | WO 2007/018877 A2 | 2/2007 |
| WO | WO 2007/029275 A1 | 3/2007 |
| WO | WO 2007/072411 A1 | 6/2007 |
| WO | WO 2008/039658 A2 | 4/2008 |
| WO | WO 2008/052559 A2 | 5/2008 |
| WO | WO 2008/105861 A2 | 9/2008 |
| WO | WO 2008/150817 A1 | 12/2008 |
| WO | WO 2009/056497 A1 | 5/2009 |
| WO | WO 2009/076477 A1 | 6/2009 |
| WO | WO 2009/112988 A1 | 9/2009 |
| WO | WO 2010/054014 A1 | 5/2010 |
| WO | WO 2010/104953 A1 | 9/2010 |
| WO | WO 2010/115549 A1 | 10/2010 |
| WO | WO 2011/097020 A2 | 8/2011 |
| WO | WO 2011/118315 A1 | 9/2011 |
| WO | WO 2012/032437 A1 | 3/2012 |
| WO | WO 2012/044419 A1 | 4/2012 |
| WO | WO 2012/099854 A1 | 7/2012 |
| WO | WO 2012/118916 A2 | 9/2012 |
| WO | WO 2012/129357 A2 | 9/2012 |
| WO | WO 2012/148644 A2 | 11/2012 |
| WO | WO 2013/044195 A2 | 3/2013 |
| WO | WO 2013/055733 A1 | 4/2013 |
| WO | WO 2013/103470 A1 | 7/2013 |
| WO | WO 2013/142552 A1 | 9/2013 |
| WO | WO 2013/155377 A1 | 10/2013 |
| WO | WO 2013/192143 A1 | 12/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/066576 A1 | 5/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/020698 A2 | 2/2015 |
| WO | WO 2015/051291 A1 | 4/2015 |
| WO | WO 2015/126928 A1 | 8/2015 |
| WO | WO 2015/126928 A4 | 12/2015 |

OTHER PUBLICATIONS

Prahlad, H. et al., "Programmable Surface Deformation: Thickness-Mode Electroactive Polymer Actuators and Their Applications," Proc. SPIE, vol. 5759, 102, 2005, 12 pages.

(56) References Cited

OTHER PUBLICATIONS

International Search Report for PCT/US2008/068614, dated Oct. 22, 2008 (1 page).
Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.
Akle, Barbar J., et al., "Ionic Electroactive Hybrid Transducers," Smart Structures and Materials 2005: Electroactive Polymer Actuators and Devices (EAPAD), Proceedings of SPIE, Bellingham, WA, vol. 5759, 2005, pp. 153-164.
Anderson, R.A., "Mechanical Stress in a Delectric Solid From a Uniform Electric Field," The American Physical Society, 1986, pp. 1302-1307.
Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.
Ashley, S., "Artificial Muscles", Scientific American 2003, pp. 53-59.
Ashley, S., "Smart Skis and Other Adaptive Structures," Mechanical Engineering, Nov. 1995, pp. 77-81.
Bar-Cohen, Yoseph, JPL, WorldWide ElectroActive Polymers, EAP (Artifical Muscles) Newsletter, vol. 1, No. 1, Jun. 1999.
Bar-Cohen, Yoseph, JPL, WorldWide ElectroActive Polymers, EAP (Artifical Muscles) Newsletter, vol. 1, No. 2, Dec. 1999.
Bar-Cohen, Yoseph, JPL, WorldWide ElectroActive Polymers, EAP (Artifical Muscles) Newsletter, vol. 2, No. 1, Jul. 2000.
Bar-Cohen, Yoseph, JPL, WorldWide ElectroActive Polymers, EAP (Artifical Muscles) Newsletter, vol. 2, No. 2, Dec. 2000.
Bar-Cohen, Yoseph, JPL, WorldWide ElectroActive Polymers, EAP (Artifical Muscles) Newsletter, vol. 3, No. 1, Jun. 2001.
Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).
Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.
Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).
Beckett, J., "New Robotics Tap the Mind, Help the Heart, SRI shows of latest technologies," San Francisco Chronicle, Aug. 27, 1998.
Begley, M. et al., "The Electro-Mechanical Response to Highly Compliant Substrates and Thin Stiff Films with Periodic Cracks," International Journal of Solids and Structures, 42:5259-5273, 2005.
Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.
Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).
Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).
Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).
Bharti, V.,X.-Z. Zhao, Q.M. Zhang, T. Romotowski, F. Tito, and R. Ting, "Ultrahigh Field Induced Strain and Polarization Response in Electron Irradiated Poly(Vinylidene Fluoride-Trifluoroethylene) Copolymer,"Mat. Res. Innovat. vol. 2, pp. 57-63 (1998).
Biomimetic Products, Inc., hhtp://www.biomimetic.com, Jun. 6, 2001.
Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.
Bohon, K. and S. Krause, "An Electrorheological Fluid and Siloxane Gel Based Electromechanical Actuator: Working Toward an Artificial Muscle," to be published in J. Polymer Sci., Part B. Polymer Phys. (2000).
Boyle, W. et al., "Departure from Paschen's Law of Breakdown in Gases," The Physical Review, Second Series, 97(2): 255-259, Jan. 15, 1955.
Brock, D.L., "Review of Artifical Muscle based on Contractile Polymers," MIT Artificial Intelligence Laboratory, A.I. Memo No. 1330, Nov. 1991.
Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).
Calvert, P. and Z. Liu, "Electrically Stimulated Bilayer Hydrogels as Muscles," Proceedings of the SPIE International Symposium on Smart Structures and Materials: Electro-Active Plymer Actuators and Devices, Mar. 1-2, 1999, Newport Beach, California, USA, pp. 236-241.
Campolo, D., et al., "Efficient Charge Recovery Method for Driving Piezoelectric Actuators with Quasi-Square Waves," IEEE Transaction on Ultrasonics, Ferroelectrics and Frequency Control, IEE, US, vol. 50, No. 3, Mar. 1, 2003, pp. 237-244.
Chen et al., "Active control of low-frequency sound radiation from vibrating panel using planar sound sources," Journal of Vibration and Acoustics, vol. 124, pp. 2-9, Jan. 2002.
Chen, Zheng et al., "Quasi-Static Positioning of Ionic Polymer-Metal Composite (IPMC) Actuators," Proceedings of the 2005 IEEE/ASME International Conference on Advanced Intelligent Mechatronics, Monterey, California, Jul. 24-28, 2005, pp. 60-65.
Cheng, Z.-Y., H.S. Xu, J. Su, Q. M. Zhjang, P.-C. Wang and A.G. MacDiarmid, "High Performance of All-Polymer Electrostrictive Systems," Proceedings of the Spie Ineternational Symposium on Smart Structures and Materials: Electro-Active Polymer Actuators and Devices, Mar. 1-2, 1999, Newport Beach, California, USA, pp. 140-148.
Cheng, Z.-Y., T.-B. Xu, V. Bharti, S. Wang, and Q.M. Zhang, "Transverse Strain Responses in the Electrostrictive Poly(Vinylidene Fluoride-Trifluorethylene) Copolymer," Appl. Phs. Lett. vol. 74, No. 13, pp. 1901-1903, Mar. 29, 1999.
Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.
Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen, Proceedings of SPIE, 6168 (6168Q), 2006.
De Rossi, D., and P. Chiarelli, "Biomimetic Macromolecular Actuators," Macro-Ion Characterization, American Chemical Society Symposium Series, vol. 548, Ch. 40, pp. 517-530 (1994).
Dowling, K., Beyond Faraday-NonTraditional Actuation, available on the World Wide Web at http://www.frc.ri.cmu.edu/~nivek/OTH/beyond-faraday/beyondfaraday.html, 9 pages, 1994.
Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).
Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.
Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Sys-

(56) References Cited

OTHER PUBLICATIONS tems, vol. 1, No. 1, pp. 44-51 (Mar. 1992); also published as MIT AI Laboratory Memo 1269, Massachusetts Institute of Technology (Feb. 1991).

Ford, V. and J. Kievet, "Technical Support Package on Traveling-Wave Rotary Actuators", NASA Tech Brief, vol. 21, No. 10, Item #145, from JPL New Technology Report NPO-19261, Oct. 1997.

Full, R.J. and K. Meijer, "Artificial Muscles Versus Natural Actuators from Frogs to Flies," Proceedings of the 7th SPIE Symposium on Smart Structures and Materials-Electroactive Polymers and Devices (EAPAD) Conference, Mar. 6-8, 2000, Newport Beach, California, USA, pp. 2-9.

Furuhata, T., T. Hirano, and H. Fujita, "Array-Driven Ultrasonic Microactuators," Solid State Sensors and Actuators, 1991, Digest of Tech. Papers, Transducers, pp. 1056-1059.

Furukawa, T. and N. Seo, "Electrostriction as the Origin of Piezoelectricity in Ferroelectric Polymers," Japanese J. Applied Physics, vol. 29, No. 4, pp. 675-680 (Apr. 1990).

Gardner, J.W., "Microsensors: Principles and Applications," John Wiley, 1994. (Book—not attached).

Ghaffarian, S.R., et al., "Electrode Structures in High Strain Actuator Technology," Journal of Optoelectronics and Advanced Materials, Nov. 2007, 9(11), pp. 3585-3591.

Gilbertson, R.G. and J.D. Busch. "Survey of MicroActuator Technologies for Future Spacecraft Missions," presented a the conference entitled "Practical Robotic Interstellar Flight: Are We Ready?" New York University and the United Nations, New York. (Aug. 29 and Sep. 1, 1994); also published on the World Wide Web at http://nonothinc.com/nanosci/microtech/mems/ten-actuators/gilbertson.html.

Goldberg, Lee, "Adaptive-Filtering Developments Extend Noise-Cancellation Applications," Electronic Design, Feb. 6, 1995, pp. 34 and 36.

Greene, M. J.A. Willett, and R. Kornbluh, "Robotic Systems," in ONR Report 32198-2, Ocean Engineering and Marine Systems 1997 Program (Dec. 1997).

Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.

Hansen, G., "High Aspect Ratio Sub-Micron and Nano-Scale Metal Filaments," SAMPE Journal, 41(2): 24-33, 2005.

Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).

Heydt, R., R. Kornbluh, R. Pelrine, and B. Mason, "Design and Performance of an Electrostrictive Polymer Film Acoustic Actuator," Journal of Sound and Vibration (1998) 215(2), 297-311.

Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.

Hirose, S., Biologically Inspired Robots: Snake-like Locomotors and Manipulators, "Development of the ACM as a Manipulator," Oxford University Press, New York, 1993, pp. 170-172.

http://www.neurosupplies.com/pdf_files/transducers.pdf, printed from web Jul. 25, 2001.

Huang, Cheng et al., "Colossal Dielectric and Electromechanical Responses in Self-Assembled Polymeric Nanocomposites", Applied Physics Letters 87, 182901 (2005), pp. 182901-1 through 182901-3.

Hunter, I.W. and S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.

Hunter, I., S. Lafontaine, J. Hollerbach, and P. Hunter, "Fast Reversible NiTi Fibers for Use in MicroRobotics," Proc. 1991 IEEE Micro Electro Mechanical Systems-MEMS '91, Nara, Japan, pp. 166-170.

Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.

Joseph, J., R. Pelrine, J. Eckerle, J. Bashkin, and P. Mulgaonkar, "Micro Electrochemical Composite Sensor", SRI International, printed from web Jul. 25, 2001.

Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.

Kawamura, S., K. Minani, and M. Esashi, "Fundamental Research of Distributed Electrostatic Micro Actuator," Technical Digest of the 11th Sensor Symposium, pp. 27-30 (1992).

Khuri-Yakub et al., "Silicon micromachined ultrasonic transducers," Japan Journal of Applied Physics, vol. 39 (2000), pp. 2883-2887, Par 1, No. 5B, May 2000.

Kinsler et al., Fundamentals of Acoustics, Third Edition, John Wiley and Sons, 1982.

Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.

Kornbluh, R., R. Pelrine, R. Heydt, and Q. Pei, "Acoustic Actuators Based on the Field-Activated Deformation of Dielectric Elastomers," (2000).

Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.

Kornbluh, R., "Description of Children's Tour," Aug. 20, 2000.

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.

Kornbluh, R., R. Pelrine, J. Joseph, "Elastomeric Dielectric Artificial Muscle Actuators for Small Robots," Proceedings of the Third IASTED International Conference on Robotics and Manufacturing, Jun. 14-16, 1995, Cancun, Mexico.

Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.

Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.

Kornbluh, R. et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.

Kornbluh, R., Pelrine, R., Eckerie, J., Joseph, J., "Electrostrictive Polymer Artificial Muscle Actuators," IEEE International Conference on Robotic and Automation, Leuven, Belgium, 1998.

Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh et al., "Medical Applications of New Electroactive Polymer Artificial Muscles," SRI International, Menlo Park, CA, JSPP, v. 16, 2004.

Kornbluh, Roy D., Robotic Systems, Ocean Engineering and Marine Systems, 2000 Program, Jan. 2001, Office of Naval Research Public Release, ONR-32100-1.

Kornbluh, Roy D., Robotic Systems, Ocean Engineering and Marine Systems, 1999 Program, Feb. 2000, Office of Naval Research Public Release, ONR-32100-2.

Kornbluh, Roy D., Robotic Systems, Ocean Engineering and Marine Systems, 1997 Program, Dec. 1997, Office of Naval Research Public Release, ONR-32198-2.

Kornbluh, Roy D., Robotic Systems, Ocean Engineering and Marine Systems, 1998 Program, Feb. 1999, Office of Naval Research Public Release, ONR-32199-4.

Kornbluh, R., "Presentation to Colin Corporation", Jan. 1997.

(56) References Cited

OTHER PUBLICATIONS

Kornbluh, R. Presentation to Medtronic, "Elastomeric Polymer Actuator and Transducers: The Principles, Performance and Applications of a New High-Strain Smart Material Technology", SRI International Medtronic Forum, Brooklyn Center, Minnesota, Jan. 2000.Jan. 2000.

Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Kornbluh, R., Pelrine, R. Joseph, J., Pei, Q. and Chiba., "Ultra-High Strain Response of Elastomeric Polymer Dielectrics", Proc. Materials Res. Soc., Fall meeting, Boston, MA, pp. 1-12, Dec. 1999.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, R., "Use of Artificial Muscle Butterfly for Chronicle Newpaper Photograph," Aug. 1998.

Ktech's PVDF Sensors, http://www.ktech.com/pvdf.htm, Jun. 6, 2001, pp. 1-5.

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.

Lacour, S. et al., "Mechanisms of Reversible Stretchability of Thin Metal Films on Elastomeric Substrates, "Applied Physics Letters 88, 204103, 2006.

Lacour, S. et al., "Stretchable Interconnects for Elastic Electronic Surfaces," Proceedings of the IEEE on Flexible Electronics Technology, 93(8): 1459-1467, 2005.

Lakes, R.S., "Extreme damping in compliant composites with a negative stiffness phase" or "Extreme Damping in Composite Materials with Negative Stiffness Inclusions", Nature, 410, 565-567, Mar. (2001).

Lakes, R.S., "Extreme damping in compliant composites with a negative stiffness phase", Philosophical Magazine Letters, 81, 95-100 (2001).

Lakes, R.S., "Extreme damping in compliant composites with a negative stiffness phase" or "Extreme Damping in Composite Materials with a Negative Stiffness Phase", Physical Review Letters, 86, 2897-2900, Mar. 26 (2001).

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. and R. Arenz, "Miniature Solid-state Gas Compressor," Rev. Sci Instrum., 58(8), pp. 1487-1493, Aug. 1987.

Liu, C., Y. Bar-Cohen, and S. Leary, "Electro-statically stricted polymers (ESSP)," Proceedings of the Spie International Symposium on Smart Structures and Materials: Electro-Active Polymer Actuators and Devices, Mar. 1-2, 1999, Newport Beach, California, USA., pp. 186-190.

Liu, C. & Y. Bar-Cohen, "Scaling Laws of Microactuators and Potential Aplications of Elecroactive Polymers in MEMS", SPIE, Conference on Electroactive Polymer Actuators and Devices, Newport Beach, CA Mar. 1999.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

Madden et al., "Conducting polymer actuators as engineering materials," SPIE: Smart Materials and Structures, ed. Yoseph Bar-Cohen, Bellingham, WA, pp. 176-190, Pub 2002.

Madden, J.D. et al., "Fast contracting polypyrrole actuators", Jan. 6, 2000, Elsevier Science S.A., pp. 185-192.

Martin, J. and R. Anderson, 1999. "Electrostriction in Field-Structured Composites: Basis for a Fast Artificial Muscle?", The Journal of Chemical Physics, vol. 111, No. 9, pp. 4273-4280, Sep. 1, 1999.

Measurements Specialties, Inc.-Piezo Home, http://www.msiusa.com/piezo/index.htm, Jun. 6, 2001.

Möller, S. et al., A Polymer/semiconductor write-once read-many-times memory, Nature, vol. 26, Nov. 13, 2003, pp. 166-169, Nature Publishing Group.

Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Nguyen, T., Green, M., and Kornbluh, R., "Robotic Systems," in ONR Ocean, Atmosphere, and Space Fiscal Year 2000 Annual Reports (Jan. 2001). (Cited in U.S. Pat. No. 7,211,937 however, unable to locate).

Nihon Kohden Corporation, Operators Manual, available Oct. 1, 2001.

NXT plc, Huntingdon, UK (www.nxtsound.com) Sep. 17, 2008.

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Osterbacka, R. et al., "Two-Dimensional Electronic Excitations in Self-Assembled Conjugated Polymer Nanocrystals," Science, vol. 287:839-842, Feb. 4, 2000.

Otero, T.F., J. Rodriguez, E. Angulo and C. Santamaria, "Artificial Muscles from Bilayer Structures," Synthetic Metals, vol. 55-57, pp. 3713-3717 (1993).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.

Pei, Q., O. Inganäs, and I. Lundström, "Bending Bilayer Strips Built From Polyaniline for Artificial Electrochemical Muscles," Smart Materials and Structures, vol. 2, pp. 1-6., Jan. 22, 1993.

Pei, Qibing "Description of Conference Demonstration" Mar. 2001.

Pei et al., "Electrochemical Applications of the Bending Beam Method. 1. Mass Transport and Volume Changes in Polypyrrole During Redox," J. Phys. Chem., 1992, 96, pp. 10507-10514.

Pei, Q. et al., "Multifunctional Electroelastomer Roll Actuators and Their Application for Biomimetic Walking Robots," Smart Structures and Materials 2003. Electroactive Polymer Actuators and Devices, San Diego, CA, USA, Mar. 2003, vol. 5051, 2003, pp. 281-290, XP002291729, Proceedings of the SPIE, ISSN: 0277-786X, the whole document.

Pei, Q. et al., "Multifunctional Electroelastomer Rolls," Mat. Res. Soc. Symp. Proc., vol. 698, Nov. 26-30, 2001, Boston, MA, pp. 165-170.

Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.

Pei, Q. et al., "Recent Progress on Electroelastomer Artificial Muscles and Their Application for Biomimetic Robots", SPIE, Pub. Jun. 2004, 11 pages.

Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.

(56) References Cited

OTHER PUBLICATIONS

Pelrine, R. and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.

Pelrine, R., R. Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.

Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.

Pelrine et al., "Electrostrictive Polymer Artificial Muscle Actuators," May 1998, Proc. of the 1998 IEEE Conf. on Robotics & Automation, pp. 2147-2154.

Pelrine, R., R. Kornbluh, and J. Joseph, FY 1992 Final Report on Artifical Muscle for Small Robots, ITAD-3393-FR-93-063, SRI International, Menlo Park, California, Mar. 1993.

Pelrine, R., R. Kornbluh, and J. Joseph, FY 1993 Final Report on Artifical Muscle for Small Robots, ITAD-4570-FR-94-076, SRI International, Menlo Park, California, 1994.

Pelrine, R., R. Kornbluh, and J. Joseph, FY 1994 Final Report on Artifical Muscle for Small Robots, ITAD-5782-FR-95-050, SRI International, Menlo Park, California, 1995.

Pelrine, R., R. Kornbluh, and J. Joseph, FY 1995 Final Report on Artifical Muscle for Small Robots, ITAD-7071-FR-96-047, SRI International, Menlo Park, California, 1996.

Pelrine, R., R. Kornbluh, and J. Joseph, FY 1996 Final Report on Artifical Muscle for Small Robots, ITAD-7228-FR-97-058, SRI International, Menlo Park, California, 1997.

Pelrine, R., R. Kornbluh, and J. Joseph, FY 1997 Final Report on Artifical Muscle for Small Robots, ITAD-1612-FR-98-041, SRI International, Menlo Park, California, 1998.

Pelrine, R., R. Kornbluh, and J. Joseph, FY 1998 Final Report on Artifical Muscle for Small Robots, ITAD-3482-FR-99-36, SRI International, Menlo Park, California, 1999.

Pelrine, R., R. Kornbluh, and J. Joseph, FY 1999 Final Report on Artifical Muscle for Small Robots, ITAD-10162-FR-00-27, SRI International, Menlo Park, California, 2000.

Pelrine, R., R. Kornbluh, Q. Pei, and J. Joseph, "High Speed Electrically Actuated Elastomers with Over 100% Strain," Science, vol. 287, No. 5454, pp. 1-21, 2000.

Pelrine, R., R. Kornbluh, Q. Pei, and J. Joseph. "High Speed Electrically Actuated Elastomers with Strain Greater Than 100%", Science, Reprint Series, Feb. 4, 2000, vol. 287, pp. 836-839.

Pelrine, R., R. Kornbluh, and G. Kofod, "High Strain Actuator Materials Based on Dielectric Elastomers," submitted to Advanced Materials (May 2000).

Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.

Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.

Piezoflex(TM) PVDF Polymer Sensors, http://www.airmar.com/piezo/pvdf.htm. Jun. 6, 2001.

PowerLab ADInstruments, MLT001 High-Sensitivity Force Transducers, AD Instruments Transducers Series, printed from web Jul. 25, 2001.

Puers et al, "A Capacitive Pressure Sensor with Low Impedance Output and Active Suppression of Parasitic Effects," Sensors and Actuators, A21-A23 (1990) 108-114.

Puers, Robert, "Capacitive sensors: when and how to use them," Sensors and Actuators A, 37-38 (1993) 93-105.

Reed, C. et al., "The Fundamentals of Aging HV Polymer-Film Capacitors, " IEEE Transactions on Dielectrics and Electrical Insulation, 1(5): 904-922, 1994.

Sakarya, S., "Micromachining Techniques for Fabrication of Integrated Light Modulting Devices", Netherlands 2003, pp. 1-133.

Scheinbeim, J., B. Newman, Z. MA, and J. Lee, "Electrostrictive Response of Elastomeric Polymers," ACS Polymer Preprints, 33(2), pp. 385-386, 1992.

Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.

Seoul et al., "Electrospinning of Poly(vinylidene fluoride) Dimethylformamide Solutions with Carbon Nanotubes," Department of Textile Engineering, Inha University, Mar. 31, 2003.

Shahinpoor, M., "Micro-electro-mechanics of Ionic Polymer Gels as Electrically Controllable Artificial Muscles," J. Intelligent Material Systems and Structures, vol. 6, pp. 307-314, May 1995.

Shkel, Y. and D. Klingenberg, "Material Parameters for Electrostriction," J. Applied Physics, vol. 80(8), pp. 4566-4572, Oct. 15, 1996.

Smela, E., O. Inganas, and I. Lundstrom, "Controlled Folding of Micrometer-size Structures," Science, vol. 268, pp. 1735-1738 (Jun. 23, 1995).

Smela, E., O. Inganas, Q. Pei and I. Lundstrom, "Electrochemical Muscles: Micromachinging Fingers and Corkscrews," Advanced Materials, vol. 5, No. 9, pp. 630-632, Sep. 1993.

Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.

Sokolova, M. et al., "Influence of a Bias Voltage on the Characteristics of Surface Discharges in Dry Air," Plasma Processes and Polymers, 2: 162-169, 2005.

Sommer-Larsen, P. and A. Ladegaard Larsen, "Materials for Dielectric Elastomer Actuators," SPIE, vol. 5385, Mar. 1, 2004, pp. 68-77.

Standard Test Methods for Rubber Deterioration—Cracking in an Ozone Controlled Environment, ASTM International, D 1149-07.

Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.

Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials-Electroactive Polymers and Devices (EAPAD) Conference, Mar. 6-8, 2000, Newport Beach, CA, USA, pp. 65-72.

Suzuki et al., "Sound radiation from convex and concave domes in infinite baffle," Journal of the Acoustical Society of America, vol. 69(2), Jan. 1981.

Technology, http://www.micromuscle.com/html/technology.html, Jun. 6, 2001.

"The Rubbery Ruler", http://www.ph.unimelb.edu.au, printed from web Jul. 25, 2001.

Tobushi, H., S. Hayashi, and S. Kojima, "Mechanical Properties of Shape Memory Polymer of Polyurethane Series," in JSME International Journal, Series I, vol. 35, No. 3, 1992.

Treloar, L.R.G., "Mechanics of Rubber Elasticity," J Polymer Science, Polymer Symposium, No. 48, pp. 107-123, 1974.

Uchino, K. 1986. "Electrostrictive Actuators: Materials and Applicaions," Ceramic Bulletin, 65(4), pp. 647-652, 1986.

Unger et al. (2000), "Monolithic Microfabricated Valves and Pumps by Multilayer Soft Lithography," Science 288:113-116, no month.

Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).

Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.

Whitesides et al. (2001), "Flexible Methods for Microfluidics," Physics Today 52(6):42-47, no month.

Winters, J., "Muscle as an Actuator for Intelligent Robots," Robotics Research: Trans. Robotics International of SME, Scottsdale, AZ (Aug. 18-21, 1986).

Woodard, Improvements of ModalMax High-Fidelity Peizoelectric Audio Device (LAR-16321-1), NASA Tech Briefs, May 2005, p. 36.

Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.

(56) References Cited

OTHER PUBLICATIONS

Yam, P., "Plastics Get Wired," Scientific American, vol. 273, pp. 82-87, Jul. 1995.
Yoshio, O., "Ablation Characteristics of Silicone Insulation," Journal of Polymer Science: Part A: Polymer Chemistry, 36: 233-239, 1998.
Yuan, W. et al. "New Electrode Materials for Dielectric Elastomer Actuators, " Proc. SPIE, 6524 (6524ON), 2007.
Zhang, Q.M., V. Bharti, Z.Y. Cheng, T.B. Xu, S. Wang, T.S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.
Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).
Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.
Zhenyi, M., J.I. Scheinbeim, J.W. Lee, and B.A. Newman. 1994. "High Field Electrostrictive Response of Polymers," Journal of Polymer Sciences, Part B-Polymer Physics, vol. 32, pp. 2721-2731, 1994.
U.S. Appl. No. 14/437,741, filed Apr. 22, 2015.
U.S. Appl. No. 14/771,371, filed Aug. 28, 2015.
U.S. Appl. No. 14/649,743, filed Jun. 4, 2015.
Polyoxymethylene urea NPL document, retrieved Nov. 11, 2015.
U.S. Appl. No.14/892,762, filed Nov. 20, 2015.

\* cited by examiner

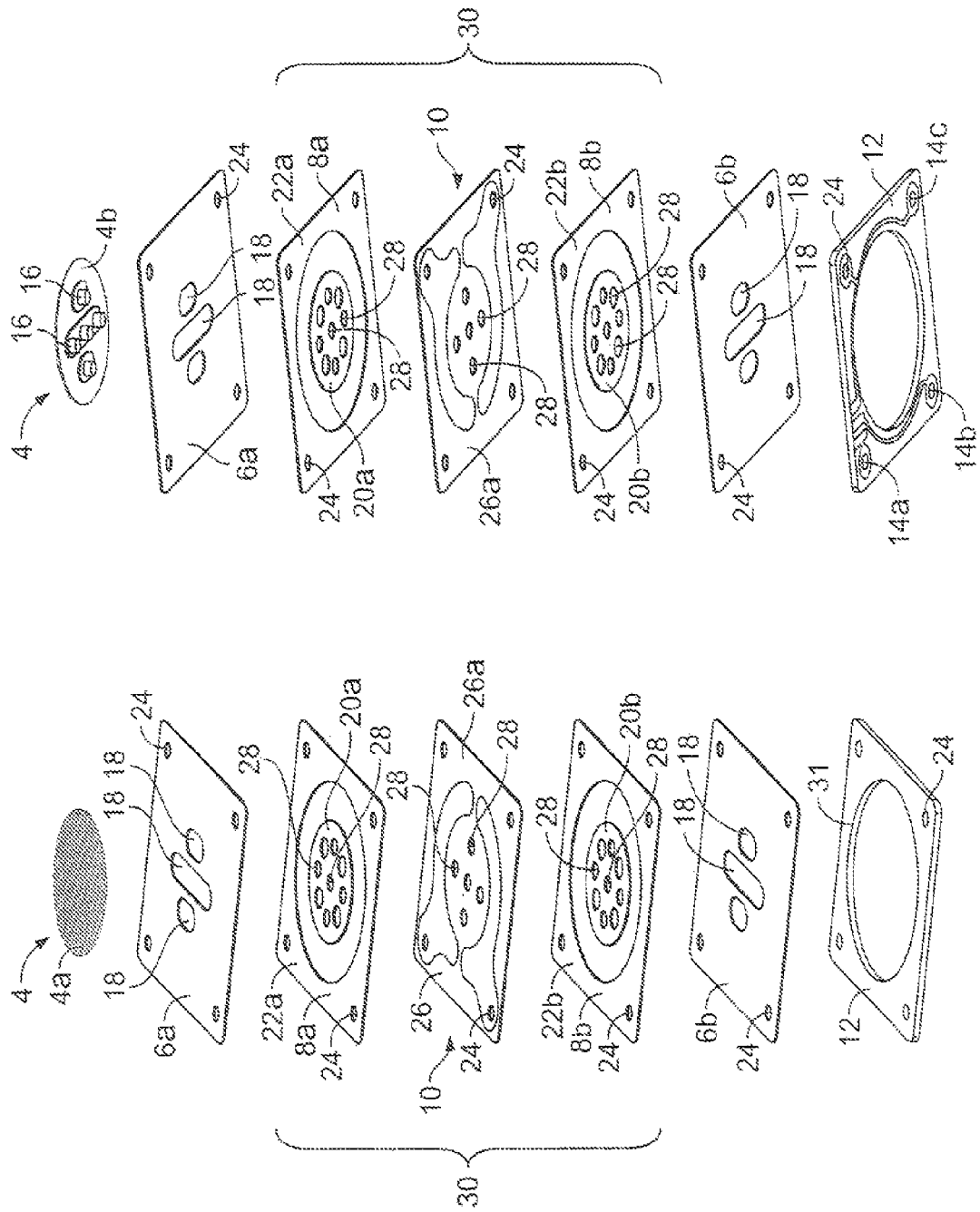

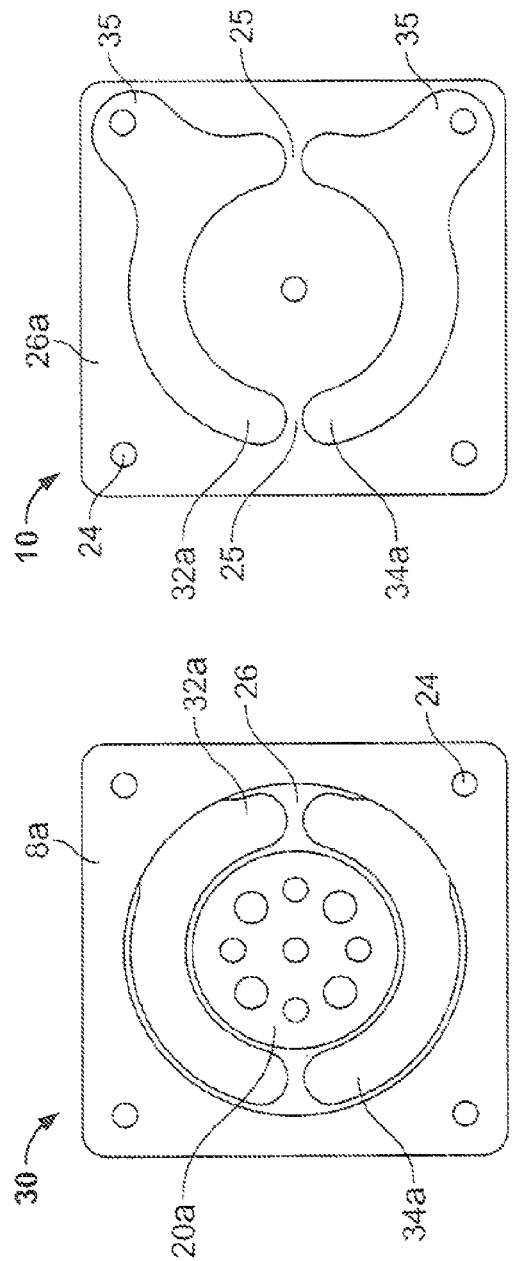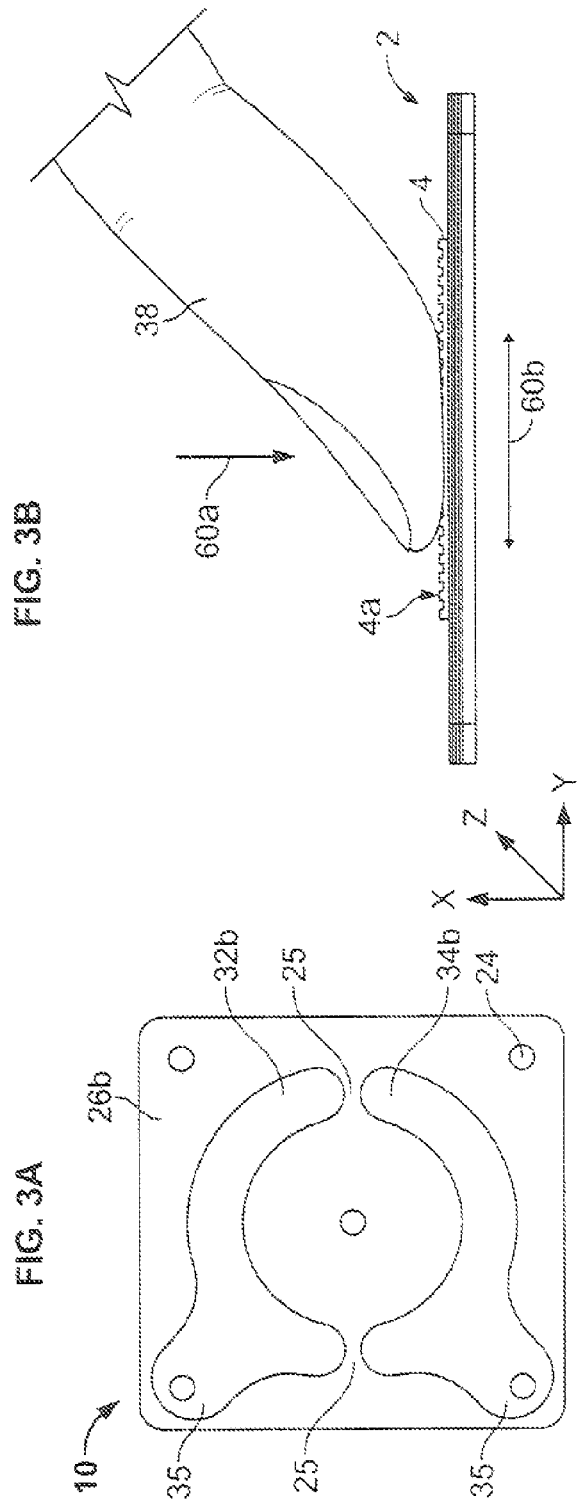

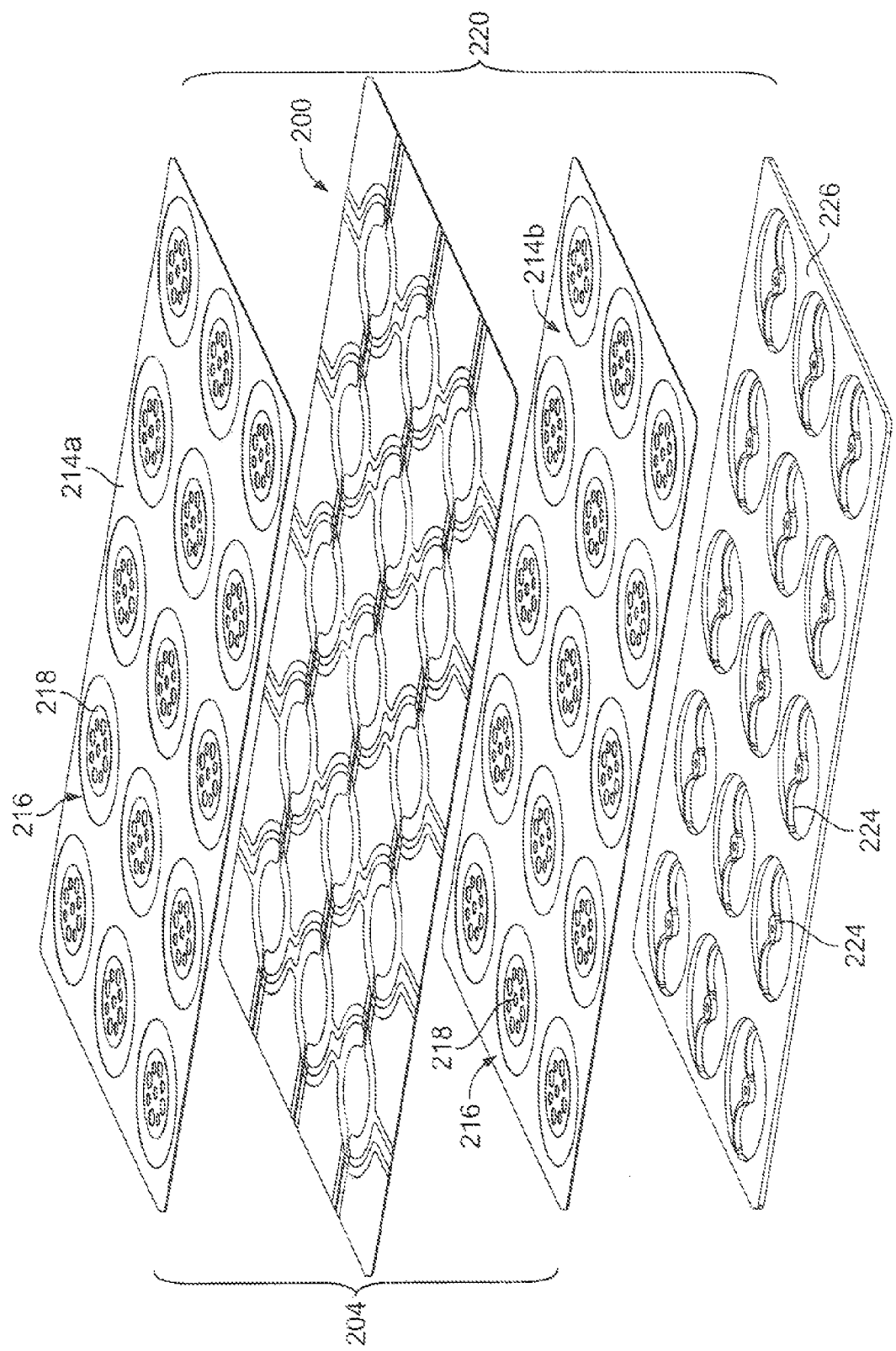

METHOD OF MANUFACTURING ELECTROACTIVE POLYMER TRANSDUCERS FOR SENSORY FEEDBACK APPLICATIONS

This application is a divisional application of U.S. Ser. No. 13/069,908 filed in the U.S. Patent Office on Mar. 23, 2011, which issued as U.S. Pat. No. 8,319,403 on Nov. 27, 2012, which is a divisional of U.S. Ser. No. 12/766,771 filed Apr. 23, 2010, which issued as U.S. Pat. No. 8,127,437 on Mar. 6, 2012, which is a divisional of U.S. Ser. No. 12/163,554, filed in the U.S. Patent Office on Jun. 27, 2008, which issued as U.S. Pat. No. 7,952,261 on May 31, 2011, which was a nonprovisional of U.S. Ser. No. 60/937,787 filed Jun. 29, 2007.

FIELD OF THE INVENTION

The present invention is directed to the use of electroactive polymer transducers to provide sensory feedback.

BACKGROUND

There are many known user interface devices which employ haptic feedback—the communication of information to a user through forces applied to the user's body, typically in response to a force initiated by the user. Examples of user interface devices which may employ haptic feedback include keyboards, touch screens, computer mice, trackballs, stylus sticks, joysticks, etc. The haptic feedback provided by these types of interface devices is in the form of physical sensations, such as vibrations, pulses, spring forces, etc., which are felt by the user.

Often, a user interface device with haptic feedback can be an input device which "receives" an action initiated by the user as well as an output device which provides haptic feedback indicating that the action was initiated. In practice, the position of some contacted or touched portion or surface, e.g., a button, of a user interface device is changed along at least one degree of freedom by the force applied by the user, where the force applied must reach some minimum threshold value in order for the contacted portion to change positions and to effect the haptic feedback. Achievement or registration of the change in position of the contacted portion results in a responsive force (e.g., spring-back, vibration, pulsing) which is also imposed on the contacted portion of the device acted upon by the user, which force is communicated to the user through his or her sense of touch.

One common example of a user interface device that employs a spring-back or "bi-phase" type of haptic feedback is a button on a mouse. The button does not move until the applied force reaches a certain threshold, at which point the button moves downward with relative ease and then stops—the collective sensation of which is defined as "clicking" the button. The user-applied force is substantially along an axis perpendicular to the button surface, as is the responsive (but opposite) force felt by the user.

Haptic feedback capabilities are known to improve user productivity and efficiency, particularly in the context of data entry. It is believed by the inventors hereof that further improvements to the character and quality of the haptic sensation communicated to a user may further increase such productivity and efficiency. It would be additionally beneficial if such improvements were provided by a sensory feedback mechanism which is easy and cost-effective to manufacture, and does not add to, and preferably reduces, the space, size and/or mass requirements of known haptic feedback devices.

SUMMARY OF THE INVENTION

The present invention includes devices, systems and methods involving electroactive transducers for sensory applications. In one variation, a user interface device having sensory feedback is provided. The device includes a user contact surface, an electroactive polymer transducer comprising an output member coupled to the contact surface, a sensor for sensing a mechanical force on the user contact surface and providing an activation signal to the transducer, wherein activation of the transducer moves at least a portion the user contact surface.

The coupling between the output member of the transducer and the user contact surface may include a mechanical means, magnetic means or both. In certain variations in which a mechanical coupling means is employed, at least one pin or protrusion extending between the output member and the user contact surface is provided. Where the pin or pins extends through the transducer sealing material, a compliant material may be used between the pin and the sealing material to ensure that the seal is not compromised upon movement of the pins. In certain embodiments, a pivotable lever is used to transfer motion from the transducer output member to the user contact surface whereby the pins extend from the lever through countersunk holes provided within the sealing material.

The user interface device may further include a sealing material adapted to substantially hermetically seal the transducer. A13. In certain embodiments, the sealing material forms a gasket between the user contact surface and the transducer, while in others, the sealing material encases the transducer.

The user interface device may be configured to provide a sensory feedback movement, i.e., movement of the contact surface which is sensed by the user, which is in a lateral or in a vertical direction relative to the contact surface. The user interface device may provide a single input or contact surface, e.g., a keypad, or may be provided in an array format having a plurality of contact surfaces, e.g., a keyboard.

The devices and systems of the present invention may be fabricated at least in part by web-based manufacturing techniques. For example, one such method includes forming at least the transducers by such techniques where an electroactive polymer film is provided and an array of electrodes is formed on the film. The electrode array is then sandwiched between a top and bottom array of frame components to form an array of electroactive polymer transducers. The resulting array may be kept in array format or may be singulated into a plurality of individual transducers, depending on the type of user interface device.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following:

FIGS. 2A and 2B show exploded top and bottom perspective views, respectively, of the sensory feedback device of FIGS. 1A-1C;

FIG. 3A is a top planar view of an assembled electroactive polymer actuator of the present invention; FIGS. 3B and 3C are top and bottom planar views, respectively, of the film portion of the actuator of FIG. 3A and, in particular, illustrate the two-phase configuration of the actuator;

FIG. 4 illustrates a side view of the sensory feedback device, of FIGS. 1A-1C with a human finger in operative contact with the contact surface of the device;

FIG. 15 is an exploded view of an array of actuators for use in the sensory feedback devices of the present invention;

Variation of the invention from that shown in the figures is contemplated.

DETAILED DESCRIPTION OF THE INVENTION

The devices, systems and methods of the present invention are now described in detail with reference to the accompanying figures.

Figure 1A:
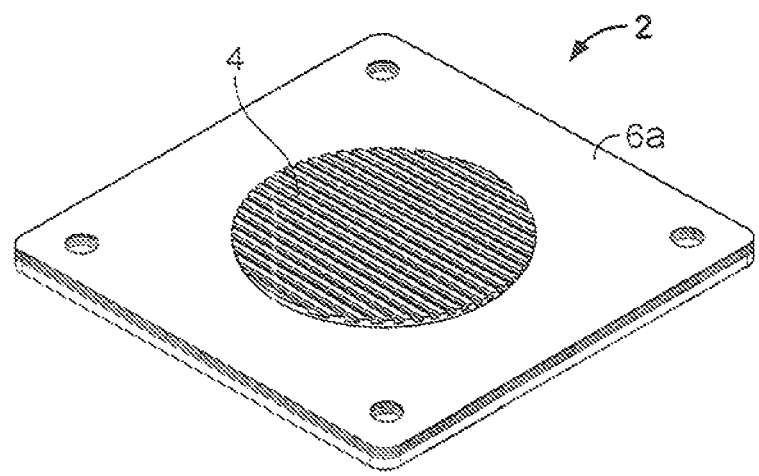
FIGS. 1A-1C show top perspective, bottom perspective and cross-sectional views, respectively, of a sensory feedback device of the present invention.
Figure 1B:
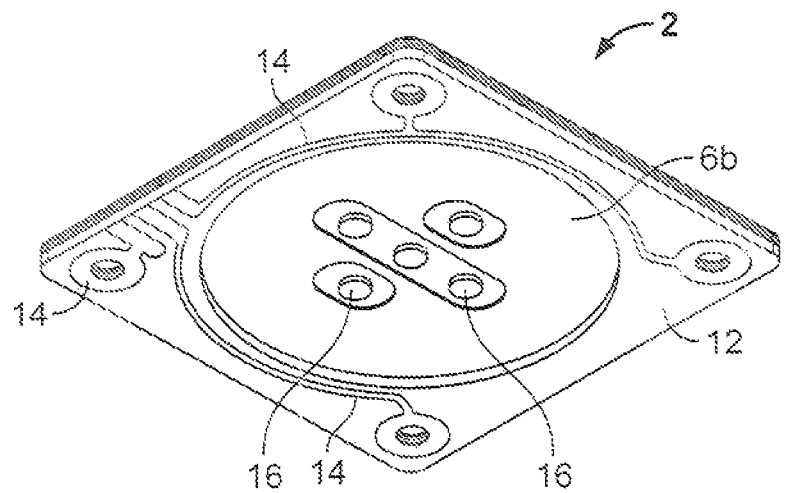
Figure 1C:
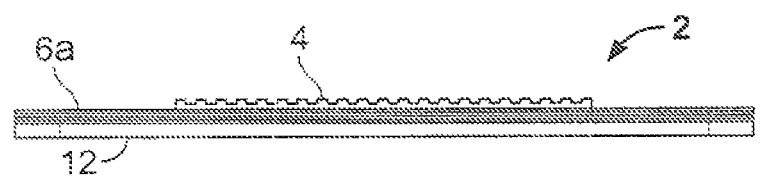

Referring to FIGS. 1A-1C, 2A and 2B, various views of are provided of an embodiment of a sensory feedback device 2 of the present invention which may be employed within a user interface device (not shown), such as with a single key within a keyboard or a discrete area of a touch screen. In an assembled form, as shown in FIGS. 1A-1C, sensory feedback device 2 has a very thin, low profile configuration (best illustrated in FIG. 1C) which may have any suitable width, length and height (thickness) dimensions to accommodate the user interface device component with which it is to be used. Typically, the width and length dimensions of device 2 substantially match or are within the width and length dimensions of the user contact surface with which it is associated. For example, for finger key or touch applications, the width and length dimensions of device 2 are typically in the range from about 10 mm to about 30 mm for square keys. The height or thickness dimension of device 2 is preferably as small as practically possible so as to reduce the profile (and size, weight and mass) of the device. For keypad applications, the thickness dimension of the device is typically about 2 mm, but may be less than about 1 mm.

Sensory or haptic feedback device 2 includes various components including, from top to bottom as illustrated in FIGS. 2A an 2B, a user interface pad 4 having a top contact surface 4a and a bottom surface 4b having a plurality of protrusions 16, the function of which is discussed below. Top surface 4a may optionally be textured to minimize slippage by a user's finger. Pad 4 is positioned atop a sensory feedback mechanism or actuator 30. Actuator 30 includes an electroactive polymer (EAP) transducer 10 in the form of an elastic film which converts electrical energy to mechanical energy. The resulting mechanical energy is in the form of physical "displacement" of an output member, here in the form of a disc 28 (discussed in greater detail below), which displacement is sensed or felt by the user's finger.

With reference to FIGS. 3A-3C. EAP transducer film 10 comprises two working pairs of thin elastic electrodes 32a, 32b and 34a, 34b where each working pair is separated by a thin layer of elastomeric dielectric polymer 26 (e.g. made of acrylic, silicone, or the like). When a voltage difference is applied across the oppositely-charged electrodes of each working pair (i.e., across electrodes 32a and 32b, and across electrodes 34a and 34b), the opposed electrodes attract each other thereby compressing the dielectric polymer layer 26 therebetween. As the electrodes are pulled closer together, the dielectric polymer 26 becomes thinner (i.e., the z-axis component contracts) as it expands in the planar directions (i.e., the x- and y-axes components expand) (see FIGS. 3B and 3C for axis references). Furthermore, like charges distributed across each electrode cause the conductive particles embedded within that electrode to repel one another, thereby contributing to the expansion of the elastic electrodes and dielectric films. The dielectric layer 26 is thereby caused to deflect with a change in electric field. As the electrode material is also compliant, the electrode layers change shape along with dielectric layer 26. Generally speaking, deflection refers to any displacement, expansion, contraction, torsion, linear or area strain, or any other deformation of a portion of dielectric layer 26. This deflection may be used to produce mechanical work.

In fabricating transducer 20, elastic film is stretched and held in a pre-strained condition by two opposing rigid frame sides 8a, 8b. It has been observed that the pre-strain improves the dielectric strength of the polymer layer 26, thereby improving conversion between electrical and mechanical energy, i.e. the pre-strain allows the film to deflect more and provide greater mechanical work. Typically, the electrode material is applied after pre-straining the polymer layer, but may be applied beforehand. The two electrodes provided on the same side of layer 26, referred to herein as same-side electrode pairs, i.e., electrodes 32a and 34a on top side 26a of dielectric layer 26 (see FIG. 3B) and electrodes 32b and 34b on bottom side 26b of dielectric layer 26 (see FIG. 3C), are electrically isolated from each other by inactive areas or gaps 25. The opposed electrodes on the opposite sides of the polymer layer from two sets of working electrode pairs, i.e., electrodes 32a and 32b for one working electrode pair and electrodes 34a and 34b for another working electrode pair. Each same-side electrode pair preferably has the same polarity, while the polarity of the electrodes of each working electrode pair are opposite each other, i.e., electrodes 32a and 32b are oppositely charged and electrodes 34a and 34b are oppositely charged. Each electrode has an electrical contact portion 35 configured for electrical connection to a voltage source (not shown).

In the illustrated embodiment, each of the electrodes has a semi-circular configuration where the same-side electrode pairs define a substantially circular pattern for accommodating a centrally disposed, rigid output disc 20a, 20b on each side of dielectric layer 26. Discs 20a, 20b, the functions of which are discussed below, are secured to the centrally exposed outer surfaces 26a, 26b of polymer layer 26, thereby sandwiching layer 26 therebetween. The coupling between the discs and film may be mechanical or be provided by an adhesive bond. Generally, the discs 20a, 20b will be sized relative to the transducer frame 22a, 22b. More specifically, the ratio of the disc diameter to the inner annular diameter of the frame will be such so as to adequately distribute stress applied to transducer film 10. The greater the ratio of the disc diameter to the frame diameter, the greater the force of the feedback signal or movement but with a lower linear displacement of the disc. Alternately, the lower the ratio, the lower the output force and the greater the linear displacement.

Because of their light weight and minimal components, EAP transducers offer a very low profile and, as such, are ideal for use in sensory/haptic feedback applications. Examples of EAP transducers and their construction are described in U.S. Pat. Nos. 7,368,862; 7,362,031; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and U.S. Published Patent Application Nos. 2006/0208610; 2008/0022517; 2007/0222344; 2007/0200468; 2007/0200467; 2007/0200466; 2007/0200457; 2007/0200454; 2007/0200453; 2007/0170822; 2006/0238079; 2006/0208610; 2006/0208609; and 2005/0157893, the entireties of which are incorporated herein by reference. Materials used as an electroactive polymer may be selected based on one or more material properties such as a high electrical breakdown strength, a low modulus of elasticity—(for large or small deformations), a high dielectric constant, etc. In one embodiment, the polymer is selected such that it has an elastic modulus at most about 100 MPa. In another embodiment, the polymer is selected such that it has a maximum actuation pressure between about 0.05 MPa and about 10 MPa, and preferably between about 0.3 MPa and about 3 MPa.

Referring again to FIGS. 2A and 2B, a backstop or insulator shield 6a made of an insulating and preferably shock-absorbing material is provided between contact pad 4 and the top surface of top transducer frame 8a. Insulating shield 6a also acts a slide bearing surface for contact pad 4. To mechanically couple contact pad 4 with transducer 30, cut-outs or thru-holes 18 are provided within backstop 6a and thru-holes 28 are provided within discs 20a and 20b as well as within dielectric film 26 to receive and accommodate protrusions or pins 16 extending from the underside 4b of contact pad 4. The thru-holes 28 within the transducer component layers may also serve to receive a means (not shown), e.g., bolts, threaded bosses, for mechanically coupling the layers together. Optionally, a bottom backstop or shield 6b may be provided on the bottom side of transducer frame 8b to provide mechanical stability as well as to act as an additional shock absorber.

The bottom side of sensory feedback device 2 includes a plate 12 which provides mechanical stability to device 2 by way of a mechanical coupling (not shown), e.g., bolts, which are placed in thru-holes 24 within each of the above described layers of device 2. Plate 12 also functions as an electrical adaptor having electrical traces or contacts 14a, 14b, 14c, which may be in the form a printed circuit board housed within the user interface device, for electrical communication with the control electronics and a source of power (discussed in greater detail below). The exemplary pattern of electrical traces includes traces 14a and 14b for connection to each of the two designate high voltage electrodes and a single trace 14c for connection to both of the grounded electrodes.

With its overall very low-profile and square shape, the sensory/haptic feedback devices of the present invention are particularly suitable for use in a keyboard, touch screen, computer mouse and other user interface devices where only a single finger 38 is used to contact the input portion of the device, as illustrated in FIG. 4. However, those skilled in the art will appreciate other configurations that are suitable for user interface devices designed for contact by a user's palm or with a hand grip, such as trackballs, stylus sticks, joysticks, etc.

With the electrode configuration described above (i.e., two working electrode pairs), transducer 10 is capable of functioning in either a single or a two-phase mode. In the manner configured, the mechanical displacement of the output component, i.e., the two coupled discs 20a and 20b, of the subject sensory feedback device described above has is lateral rather than vertical. In other words, instead of the sensory feedback signal being a force in, a direction perpendicular to the contact surface 4a of the user interface pad 4 and parallel to the input force (designated by arrow 60a in FIG. 4) applied by the user's finger 38 (but in the opposing or upward direction), the sensed feedback or output force (designated by double-head arrow 60b in FIG. 4) of the sensory/haptic feedback devices of the present invention is in a direction parallel to the contact surface 4a and perpendicular to input force 60a. Depending on the rotational alignment of the electrode pairs about an axis perpendicular to the plane of transducer 10 and relative to the position of the user interface pad 4, e.g., a keyboard key pad, and the mode in which the transducer is operated (i.e., single phase or two phase), this lateral movement may be in any direction or directions within 360°. For example, the lateral feedback motion may be from side to side or up and down (both are two-phase actuations) relative to the forward direction of the user's finger (or palm or grip, etc.). While those skilled in the art will recognize certain other actuator configurations which provide a feedback displacement which is transverse or perpendicular to the contact surface of the haptic feedback device, the overall profile of a device so configured may be greater than the aforementioned design.

Figure 5A:
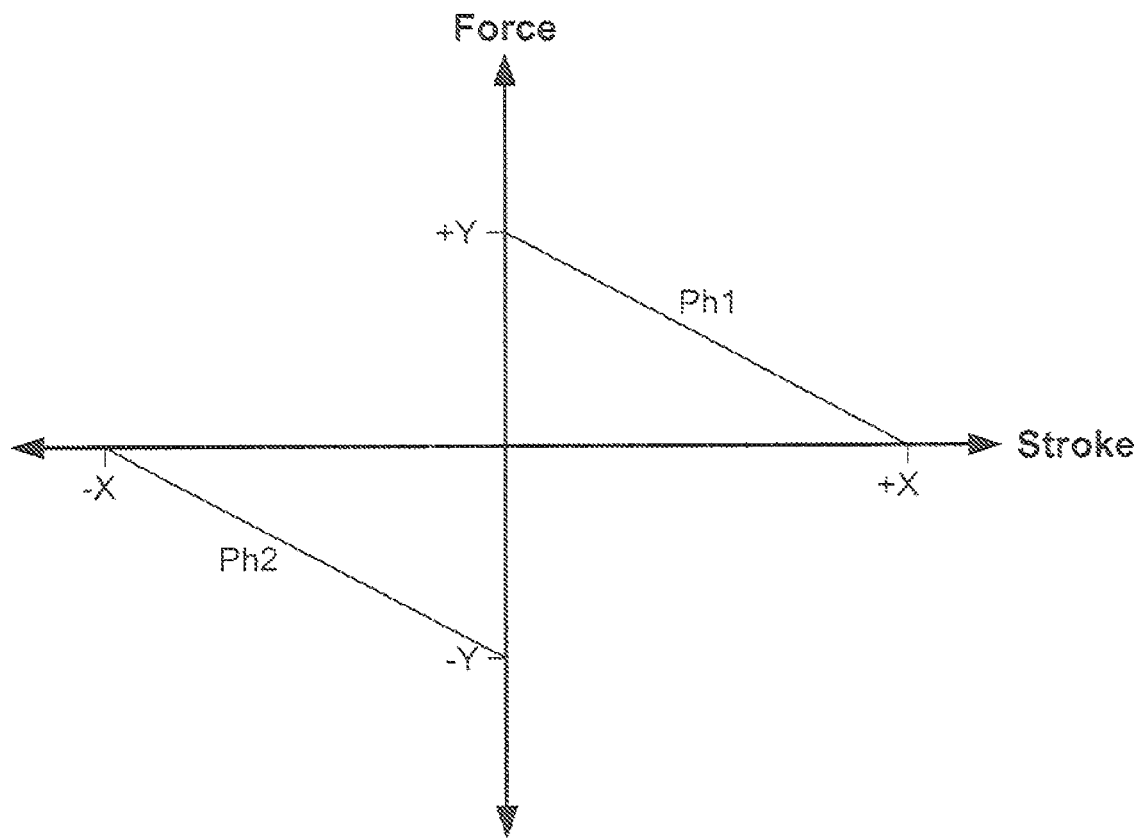
FIGS. 5A and 5B graphically illustrate the force-stroke relationship and voltage response curves, respectively, of the actuator of FIGS. 3A-3C when operated in a single-phase mode.
Figure 5B:
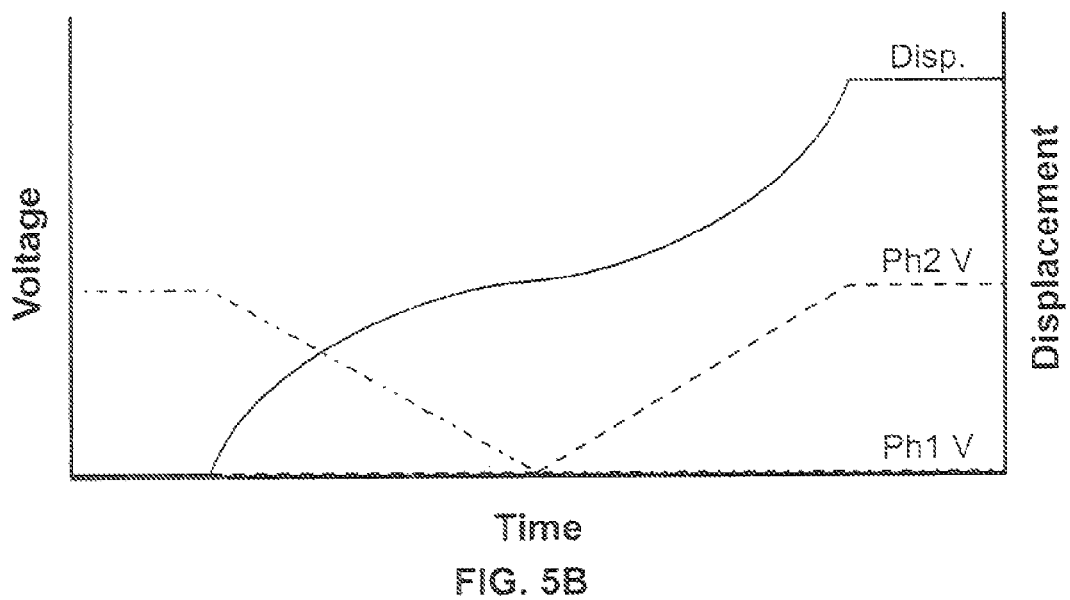

When operating sensory/haptic feedback device 2 in single-phase mode, only one working pair of electrodes of actuator 30 would be activated at any one time. The single-phase operation of actuator 30 may be controlled using a single high voltage power supply. As the voltage applied to the single-selected working electrode pair is increased, the activated portion (one half) of the transducer film will expand, thereby moving the output disc 20 in-plane in the direction of the inactive portion of the transducer film. FIG. 5A illustrates the force-stroke relationship of the sensory feedback signal (i.e., output disc displacement) of actuator 30 relative to neutral position when alternatingly activating the two working electrode pairs in single-phase mode. As illustrated, the respective forces and displacements of the output disc are equal to each other but in opposite directions. FIG. 5B illustrates the resulting non-linear relationship of the applied voltage to the output displacement of the actuator when operated in this single-phase mode. The "mechanical" coupling of the two electrode pairs by way of the shared dielectric film may be such as to move the output disc in opposite directions. Thus, when both electrode pairs are operated, albeit independently of each other, application of a voltage to the first working electrode pair (phase 1) will move the output disc 20 in one direction, and application of a voltage to the second working electrode pair (phase 2) will move the output disc 20 in the opposite direction. As the various plots of FIG. 5B reflect, as the voltage is varied linearly, the displacement of the actuator is non-linear.

Figure 6A:
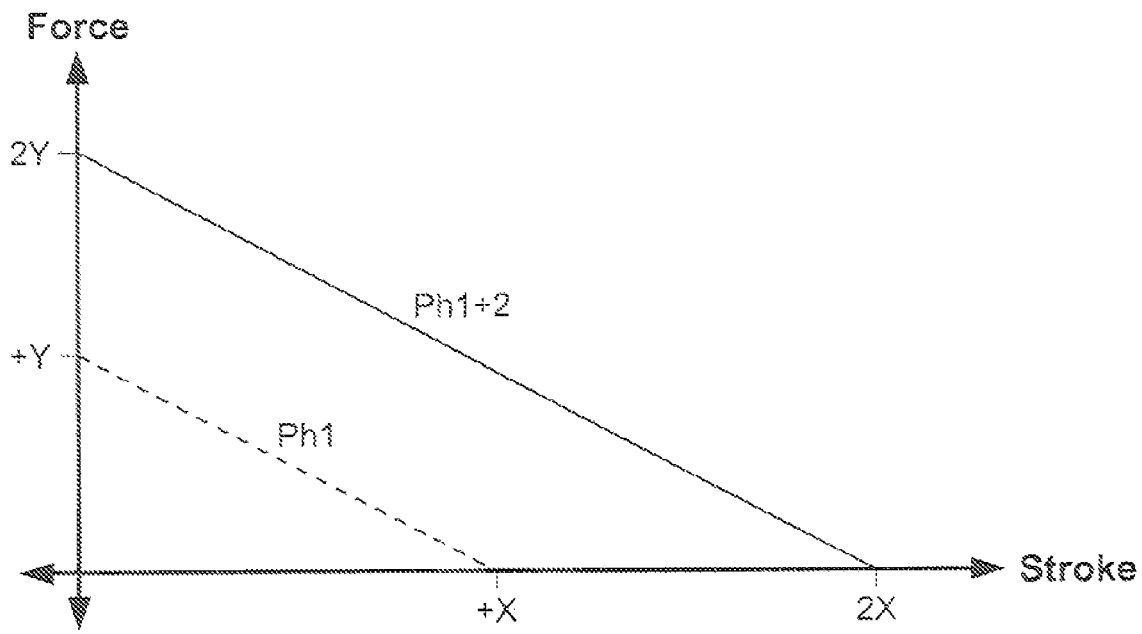
FIGS. 6A and 6B graphically illustrate the force-stroke relationship and voltage response curves, respectively, of the actuator of FIGS. 3A-3C when operated in a two-phase mode.
Figure 6B:
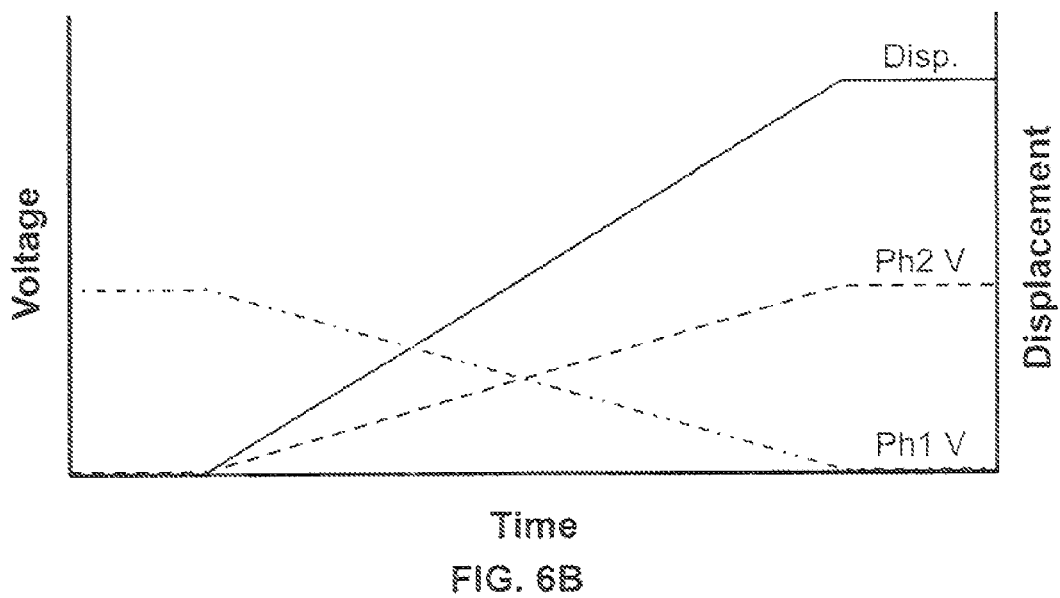
Figure 7:
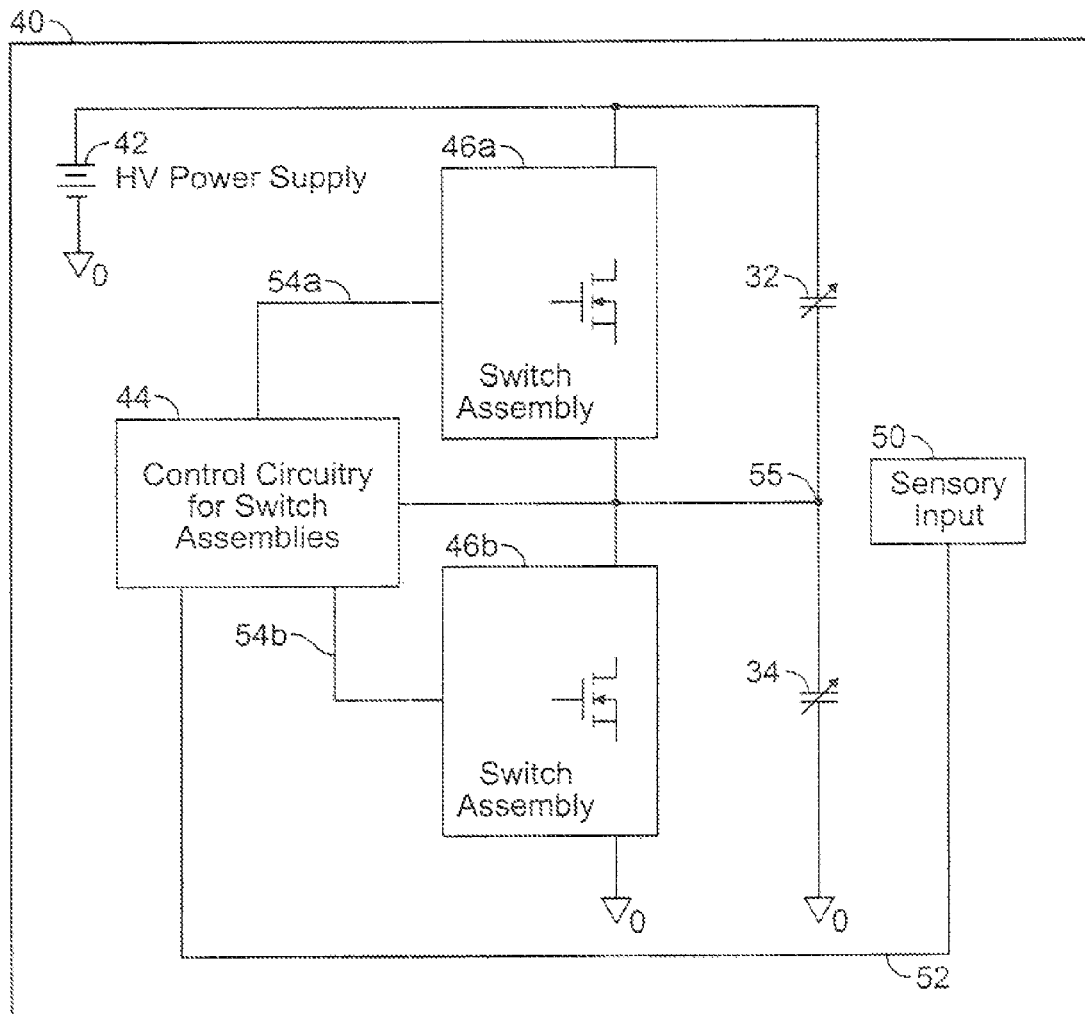
FIG. 7 is a block diagram of electronic circuitry, including a power supply and control electronics, for operating the sensory feedback device of FIGS. 1A-1C.

To effect a greater displacement of the output member or component, and thus provide a greater sensory feedback signal to the user, actuator 30 is operated in a two-phase mode, i.e., activating both portions of the actuator simultaneously. FIG. 6A illustrates the force-stroke relationship of the sensory feedback signal of the output disc when the actuator is operated in two-phase mode. As illustrated, both the force and stroke of the two portions 32, 34 of the actuator in this mode are in the same direction and have double the magnitude than the force and stroke of the actuator when operated in single-phase mode. FIG. 6B illustrates the resulting linear relationship of the applied voltage to the output displacement of the actuator when operated in this two-phase mode. By connecting the mechanically coupled portions 32, 34 of the actuator electrically in series and controlling their common node 55, such as in the manner illustrated in the block diagraph 40 of FIG. 7, the relationship between the voltage of the common node 55 and the displacement (or blocked force) of the output member (in whatever configuration) approach a linear correlation. In this mode of operation, the non-linear voltage responses of the two portions 32, 34 of actuator 30 effectively cancel each other out to produce a linear voltage response. With the use of control circuitry 44 and switching assemblies 46a, 46b, one for each portion of the actuator, this linear relationship allows the performance of the actuator to be fine-tuned and modulated by the use of varying types of waveforms supplied to the switch assemblies by the control circuitry. Another advantage of using circuit 40 is ability to reduce the number of switching circuits and power supplies needed to operate the sensory feedback device. Without the use of circuit 40, two independent power supplies and four switching assemblies would be required. Thus, the complexity and cost of the circuitry are reduced while the relationship between the control voltage and the actuator displacement are improved, i.e., made more linear.

Various types of mechanisms may be employed to communicate the input force 60a from the user to effect the desired sensory feedback 60b (see FIG. 4). For example, a capacitive or resistive sensor 50 (see FIG. 7) may be housed within the user interface pad 4 to sense the mechanical force exerted on the user contact surface input by the user. The electrical output 52 from sensor 50 is supplied to the control circuitry 44 which in turn triggers the switch assemblies 46a, 46b to apply the voltage from power supply 42 to the respective transducer portions 32, 34 of the sensory feedback device in accordance with the mode and waveform provided by the control circuitry.

Figure 8:
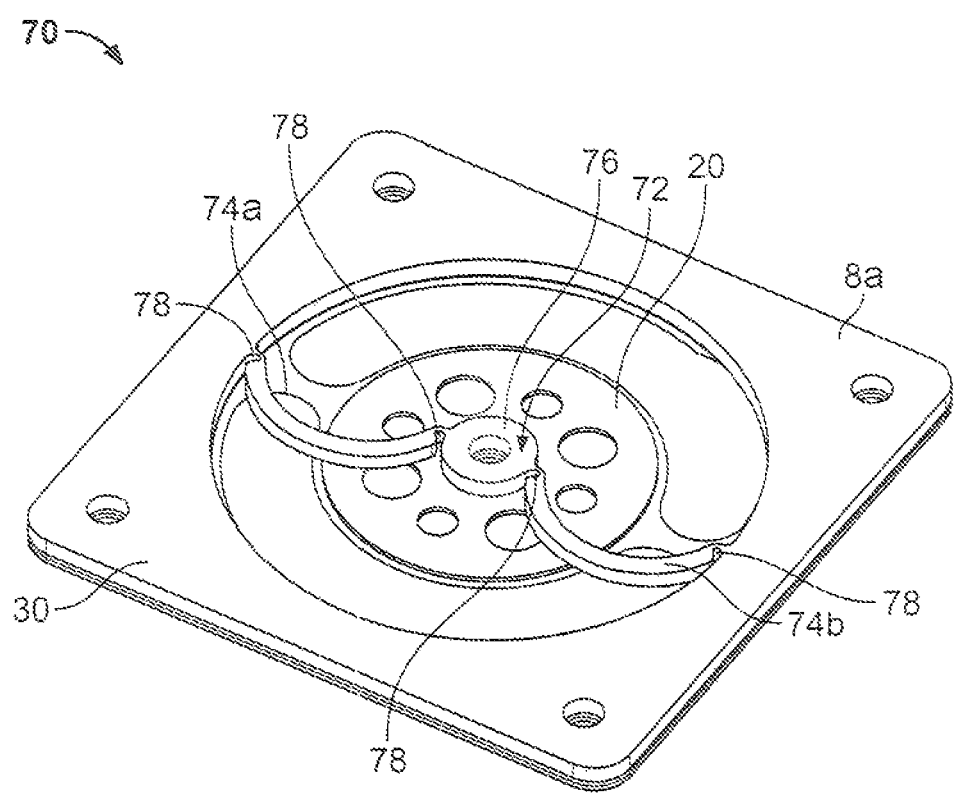
FIG. 8 illustrates an alternate bi-stable embodiment of a sensory feedback device of the present invention.

Referring now to FIG. 8, there is illustrated another actuator embodiment 70 of the present invention for use in a sensory/haptic feedback device of the present invention. Actuator 70 includes the same basic actuator structure 30 described above with the inclusion of a mechanism 72 which imposes a negative spring rate bias on output disc 20. Negative spring rate mechanism 72 includes a central hub 76 mechanically coupled to output disc 20 and two opposing leaf spring flexures 74a and 74b extending between hub 76 and a frame side 8a of the actuator. The flexures 74a, 74b are each coupled to the hub and frame by living spring joints 78. Whether operated in single-phase or two-phase mode, the actuator is inherently bi-stable. An advantage of negative biasing, at least in the context of the subject actuators, is that as the displacement/stroke distance of the output element increases, significantly less force is need to achieve a greater stroke distance. The force-stoke relationship of negative force biasing is described in detail in U.S. patent application Ser. No. 11/618,577, which is herein incorporated by reference in its entirety.

Another variation of the present invention involves the hermetic sealing of the EAP actuators to minimize any effects of humidity or moisture condensation that may occur on the EAP film. For the various embodiments described below, the EAP actuator is sealed in a barrier film substantially separately from the other components of the tactile feedback device. The barrier film or casing may be made of, such as foil, which is preferably heat sealed or the like to minimize the leakage of moisture to within the sealed film. Each of these device embodiments enables coupling of the feedback motion of the actuator's output member to the contact surface of the user input surface, e.g., keypad, while minimizing any compromise in the hermetically sealed actuator package. Various exemplary means for coupling the motion of the actuator to the user interface contact surface are also provided.

Figure 9A:
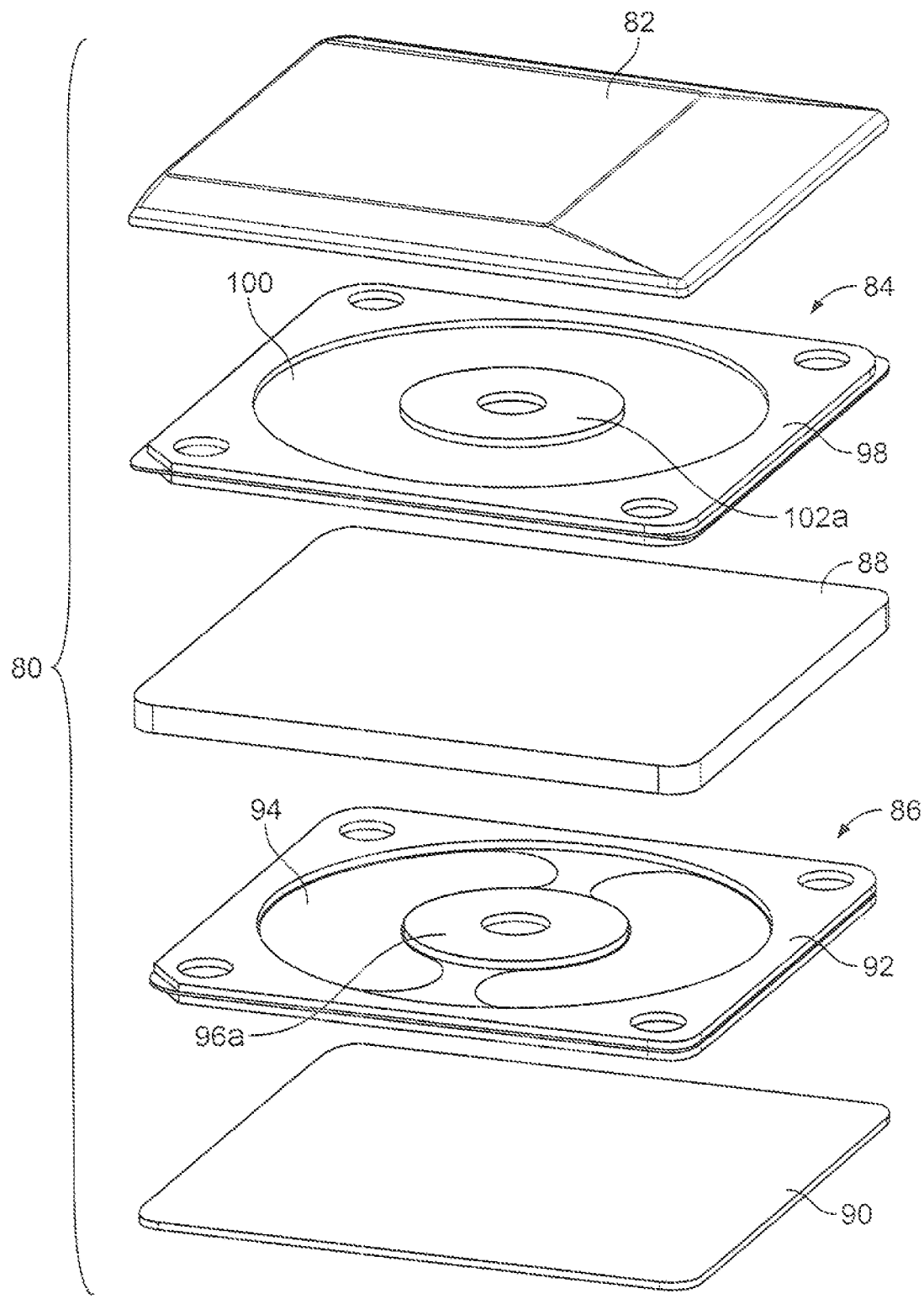
FIGS. 9A and 9B show exploded top and bottom perspective views, respectively, of another tactile feedback device of the present invention in which magnets are used to couple the actuator to the contact surface of the device.
Figure 9B:
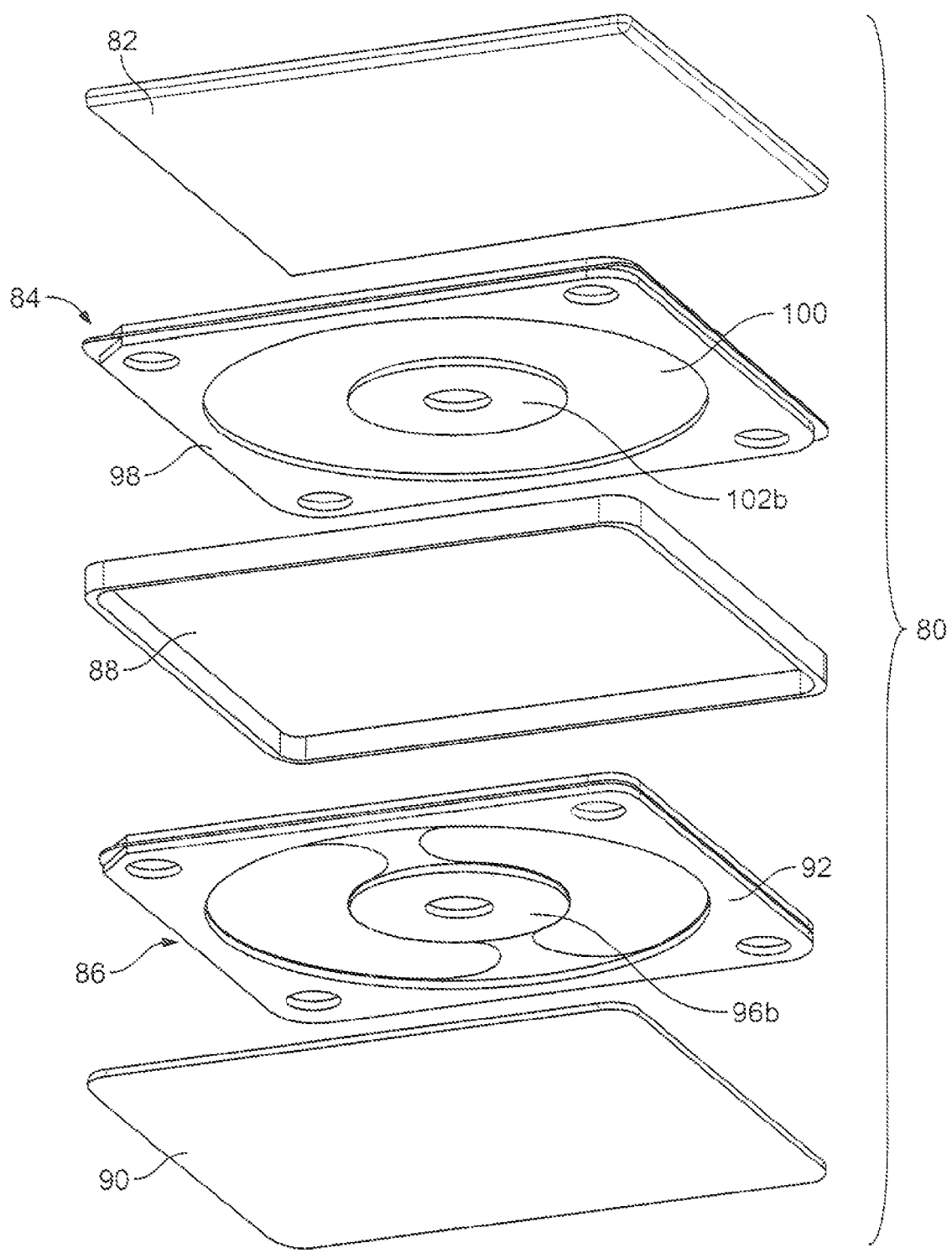

One such coupling means involves the use of magnets. FIGS. 9A and 9B illustrate a tactile feedback device employing such magnetic coupling. Device 80 includes user interface key cap 82 and EAP actuator 86, where the actuator is optionally hermetically sealed by top and bottom covers 88 and 90 which are made of magnetically inert, rigid materials. The key cap and actuator components are coupled by means of opposing magnetic units. A first magnetic unit 96a/b is provided centrally suspended within EAP film 84 held by frame 92. This magnetic unit, in essence, acts as the output member of actuator 86 and is displaced laterally or in-plane, as discussed above, upon actuation of the actuator. The second magnetic unit 102a/b is held by another cartridge 84, similarly constructed and sized to the actuator cartridge 86 in that a film 100 is held stretched within an open frame 98 with the magnetic unit held centrally suspended therein; however, unlike EAP film 84, film 100 is passive, i.e., has no electrodes. Key pad 82 or at least its underside is made of a material that is attractable to magnetic unit 102, thereby fixing the key pad to suspension cartridge 98. Both magnetic units are typically disc-shaped and may comprise a single magnet or a pair of stacked magnetic discs. In the latter arrangement, as illustrated in the FIGS. 9A and 9B, the two magnets of each pair (96a, 96b and 102a, 102b) may be oppositely polarized and thereby fixed together. The opposing suspension and actuator magnetic units may either be oppositely polarized or similarly polarized. When oppositely polarized (i.e., N-S), the magnetic units 96, 102 attract each other (through top sealing layer 88) and, thus, move in parallel/tandem upon actuation of actuator 92, i.e., the feedback motion of the keypad is in the same planar direction as that of the displacement output of the actuator. When the magnetic units 96, 102 have the same polarization (i.e., either N-N or S-S), they repel each other resulting in the units moving both vertically and horizontally away from each other, i.e., the feedback motion of the keypad is in the opposite direction as that of the displacement output of the actuator. In the latter arrangement, the respective films 94, 100 must have sufficient suspension to counter the displacement of the magnetic units caused by the repulsion. An advantage of the repelling arrangement over the attracting arrangement is that it reduces the friction between the magnets and casing 88.

Figure 10A:
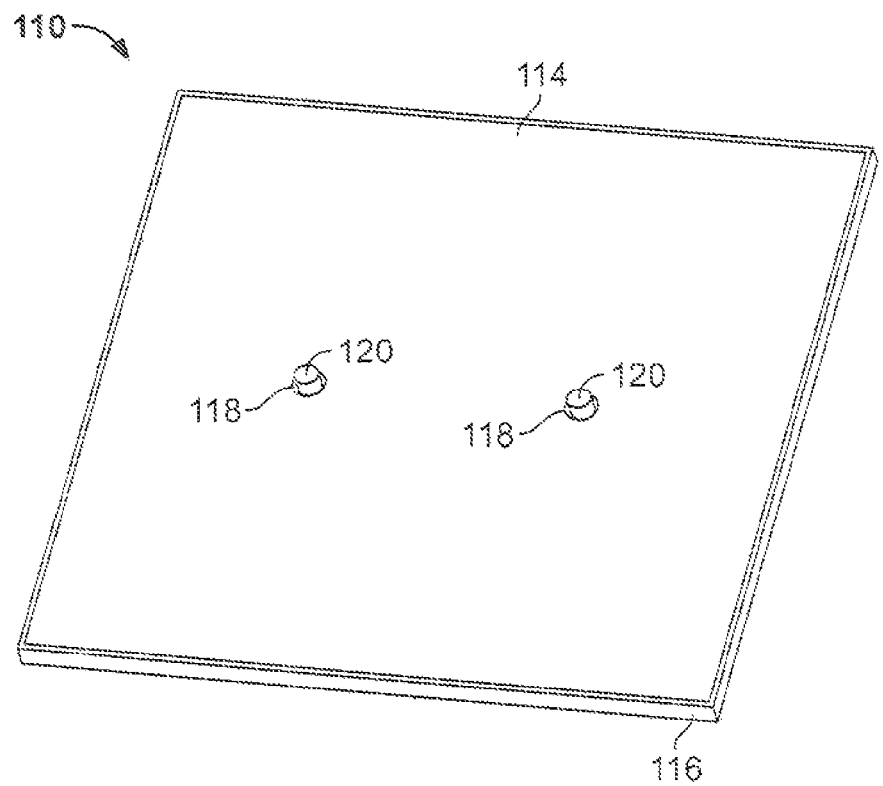
FIGS. 10A and 10B illustrate perspective assembled and exploded views, respectively, of a hermetically sealed electroactive polymer actuator of the present invention for use in the tactile feedback devices of the present invention.
Figure 10B:
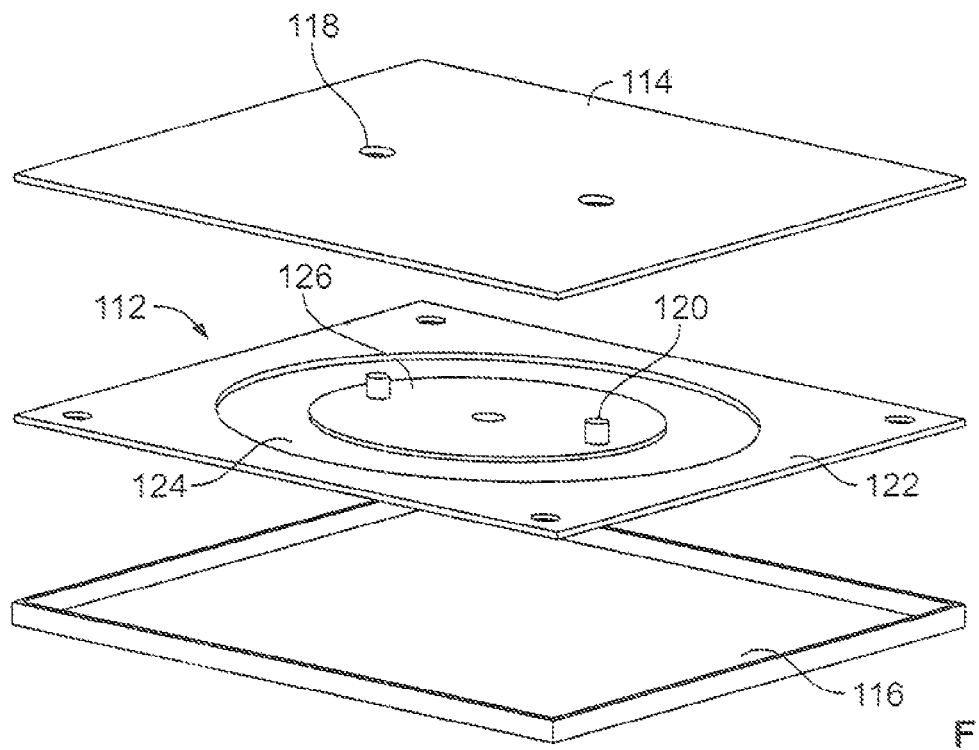

Another embodiment of a sealed actuator is illustrated in FIGS. 10A and 10B. Actuator package 110 includes actuator cartridge 112 sealed between a top and base barriers 114, 116. Actuator cartridge 112 includes open frame 122 having an EAP film 124 stretched between it and a centrally positioned output disc 126. Two (or more) protrusions or pins 120 extend from atop output disc 126 and extend through corresponding holes 118 within top sealing barrier 114 for mechanical coupling to a user input key (not shown). As such, movement of output disc 126, i.e., in the planar direction as configured, in turn translates the user input key. Mounted circumferentially about pins 120 or within holes 118 is a compliant barrier film, such as styrene-ethylene-butadiene-styrene (SEBS) block copolymer, in the form of a ring to provide an elastic and flexible seal therebetween. As such, the pins provide a bridge between the actuator and user interface pad that does not disrupt the hermetic seal about the actuator.

Figure 11A:
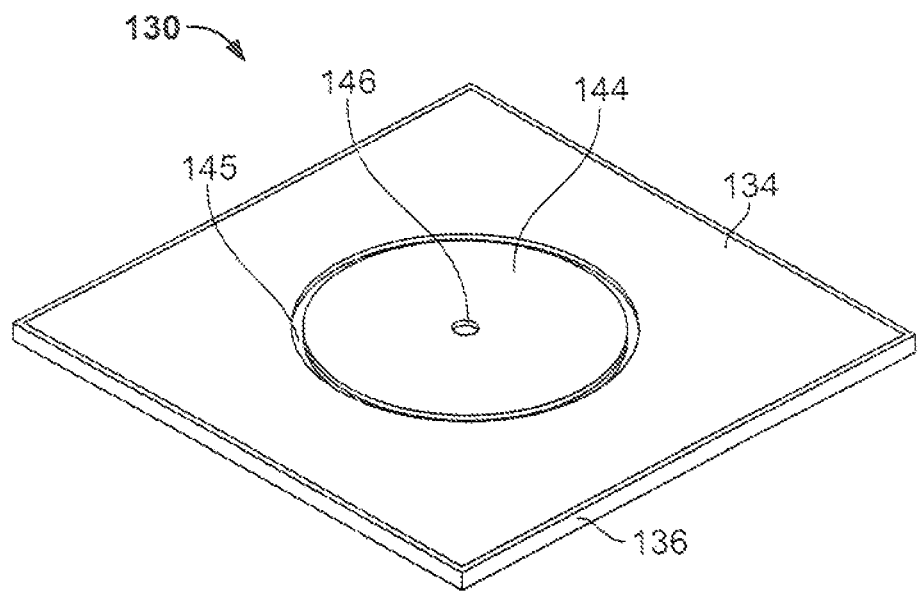
FIGS. 11A and 11B illustrate perspective assembled and exploded views, respectively, of another hermetically sealed electroactive polymer actuator of the present invention for use in the tactile feedback devices of the present invention.
Figure 11B:
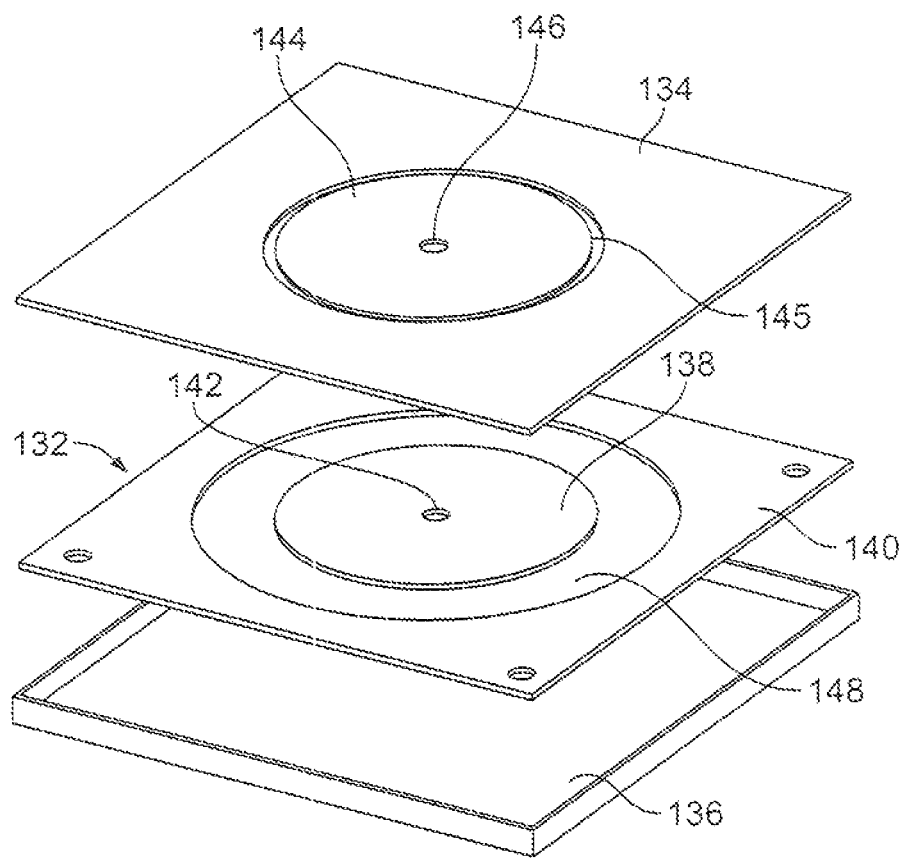

FIGS. 11A and 11B illustrate another sealed actuator package 130 having an actuator cartridge 132 sealed between top and base barriers 134, 136. Actuator cartridge 132 has an open frame 140 and an EAP film 148 stretched between it and a centrally positioned output disc 138. Top barrier 134 has a central section 144 having a shape and diameter substantially matching that of output disc 138. The gap or spacing 145 between the central section 144 and the outer portion of barrier 134 holds a compliant film material, SEBS block copolymer, to allow movement of the central portion without compromising the sealed actuator. Centrally disposed holes 142 and 146, respectively, within each of the actuator output member 138 and barrier film section 144 are aligned to provide a thru hole for receiving a pin, screw or the like for coupling the actuator output motion to a user input member (not shown).

Figure 12A:
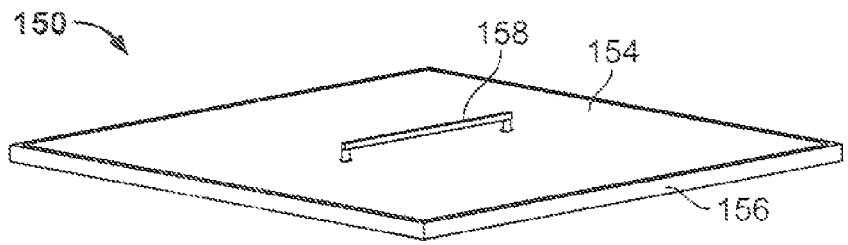
FIGS. 12A-12C illustrate assembled, exploded and cross-sectional views, respectively, of another hermetically sealed electroactive polymer actuator of the present invention for use in the tactile feedback devices of the present invention.
Figure 12B:
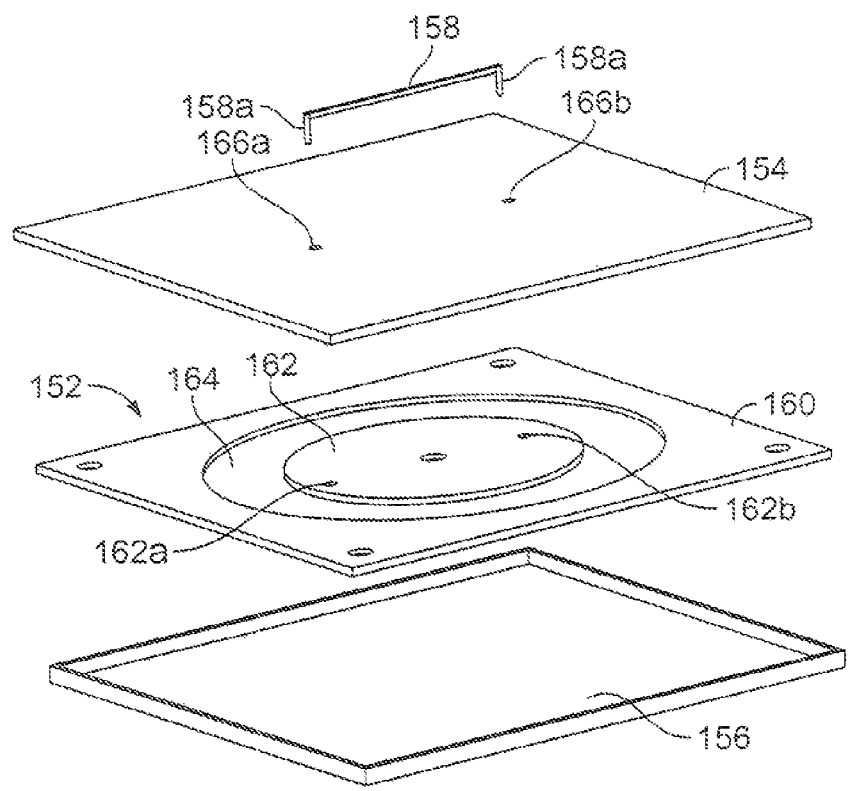
Figure 12C:
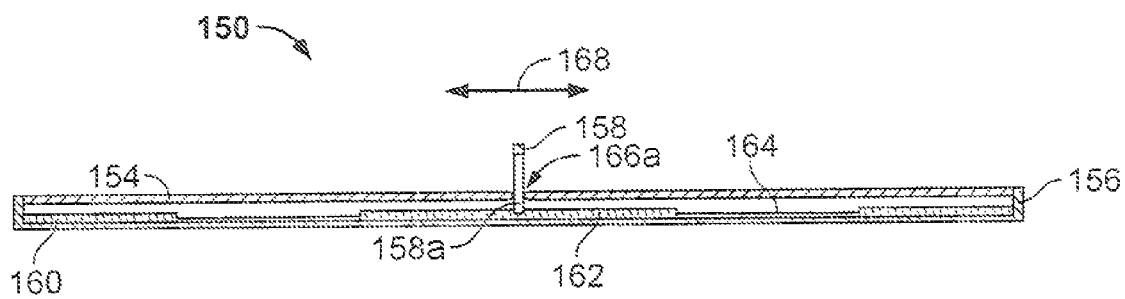

FIGS. 12A-12C illustrate another sealed actuator 150 of the present invention. Actuator package 150 includes actuator cartridge 152 sealed between a top and base barriers 154, 156. Actuator cartridge 152 includes open frame 160 having an EAP film 164 stretched between it and a centrally positioned output disc 162. Two diametrically opposing pin holes extend through top barrier 154 (166a, 166b) and output disc 162 (162a, 162b) for receiving the legs 158a of a lever bar 158. The holes 166a, 166b are countersunk (best illustrated in FIG. 12C) to allow the pins 158a to pivot therein. As such, when actuator 152 is activated with the resulting planar translation of output disc 162, the pins are caused to pivot about the fulcrum defined by the countersunk holes 168a, 168b. The resulting movement of lever bar 158, illustrated by arrows 168 in FIG. 12C, is in a direction perpendicular to the alignment of the bar. The countersunk configuration of these holes allows a close fit between the lever legs and the holes within the top barrier so as to form a seal. Optionally, the legs may be coated with a compliant material to provide a more hermetically sealed environment.

Figure 13A:
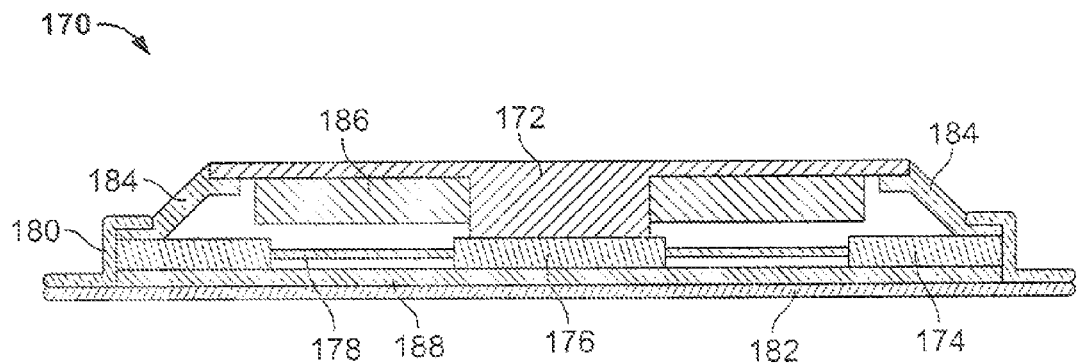
FIGS. 13A-13C illustrate another haptic feedback device of the present invention employing another variation of a hermetically sealed actuator.
Figure 13B:
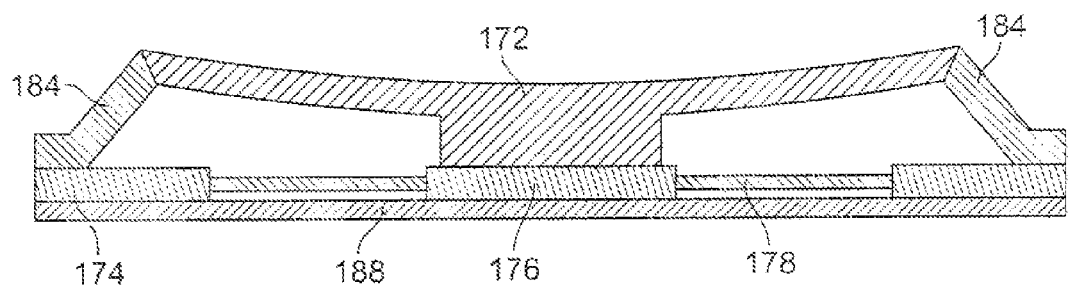
Figure 13C:
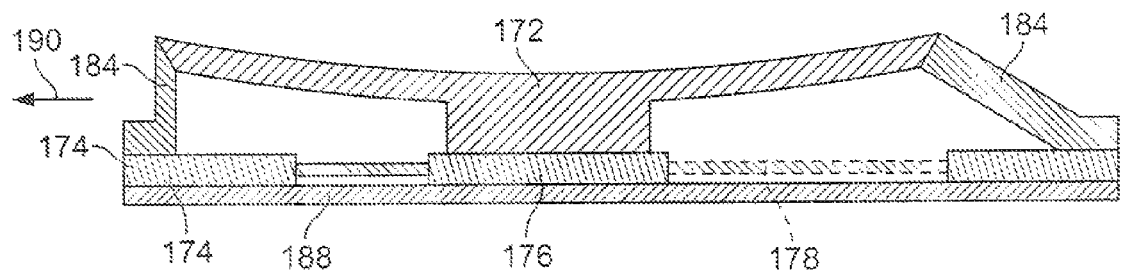

FIG. 13A illustrates another manner of hermetically sealing the actuator employed in a haptic feedback device 170 of the present invention. The actuator includes open frame 174, output disc 176 and EAP film 178 extending therebetween. The actuator is positioned atop a back plate 188 and beneath a keypad 172. Extending about the perimeter of the keypad 172 and between the keypad and actuator frame 174 is a vapor barrier membrane or gasket 184. Membrane may be molded from SEBS, Butyl, or the like. The outer edge of the assembly, including barrier membrane 184, is encased by a sealed packaging 182, which may comprise top and bottom foil layers 180, 182 or the like which are heat sealed together. Optionally, a desiccant or buffer 186 may be positioned within the space between the keypad and the actuator. FIGS. 13B and 13C illustrate device 170 (shown without the desiccant and foil packaging for clarity) when the actuator component is in passive and active states, respectively. In the passive state (FIG. 13B), like the actuator EAP film 178, the barrier membrane 184 has a symmetrical configuration about key pad 172. In the active state (FIG. 13C), the EAP film is selectively activated and/or configured such that output disc 176 moves laterally in one direction, as indicated by arrow 190. In turn, keypad 172 is caused to move in the same direction. The barrier film material 184 is able to stretch and compress to accommodate the movement of keypad 172.

The actuators of the present invention may be provided in a planar array fabricated by continuous web-based manufacturing techniques. Such arrays are highly practical as sensory/haptic feedback devices are often provided in array formats themselves. A computer keyboard is a common example of such. FIGS. 14-17 illustrate arrays of various components of the haptic devices of the present invention at various points in the web fabrication process.

Figure 14A:
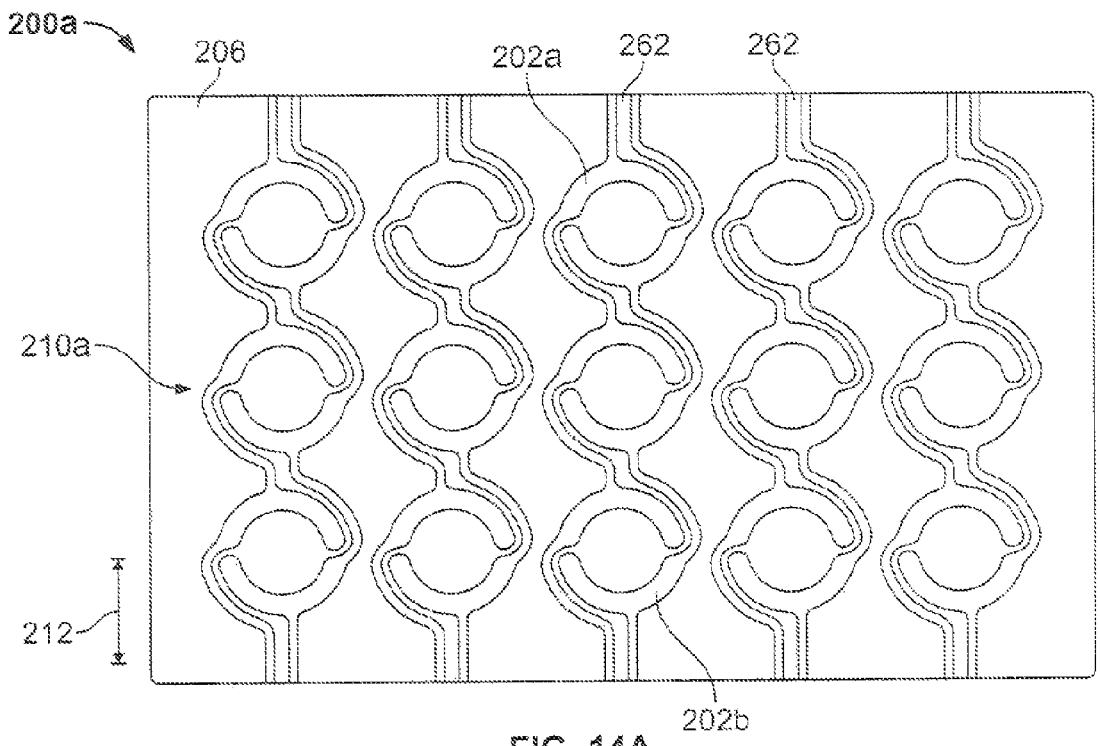
FIGS. 14A and 14B illustrate arrays, respectively, of electrode patterns disposed on opposite sides of a dielectric film material for use in an array of haptic feedback devices of the present invention.
Figure 14B:
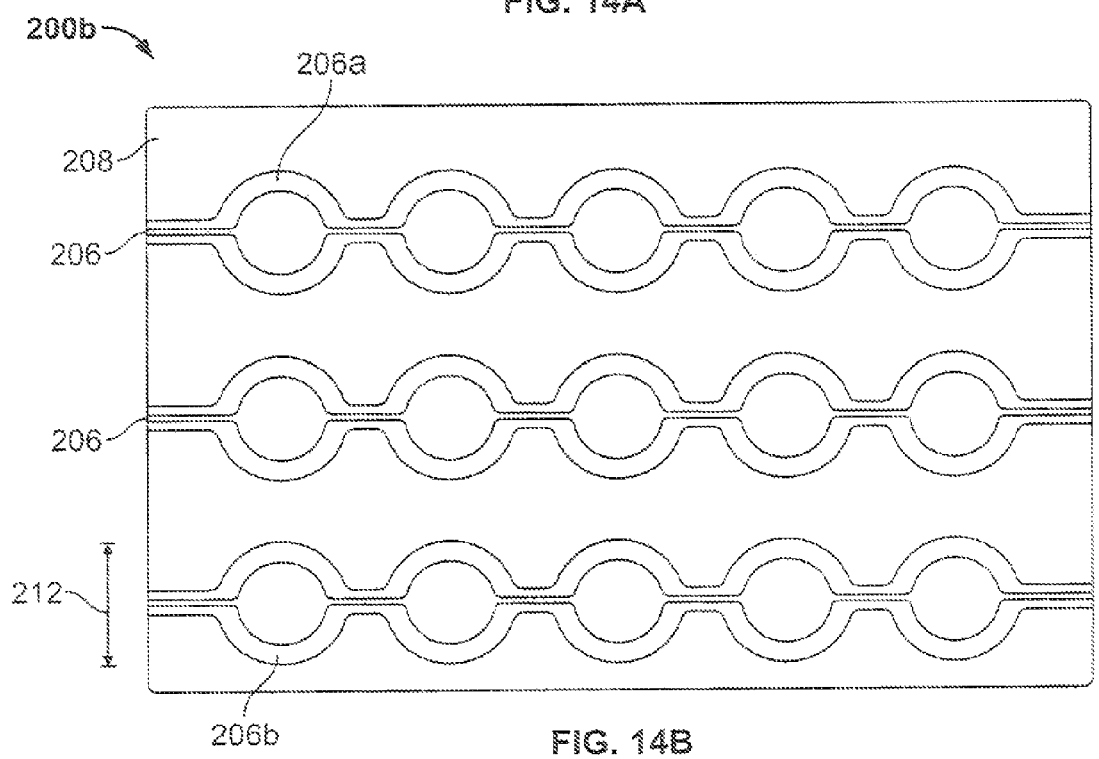
Figure 16:
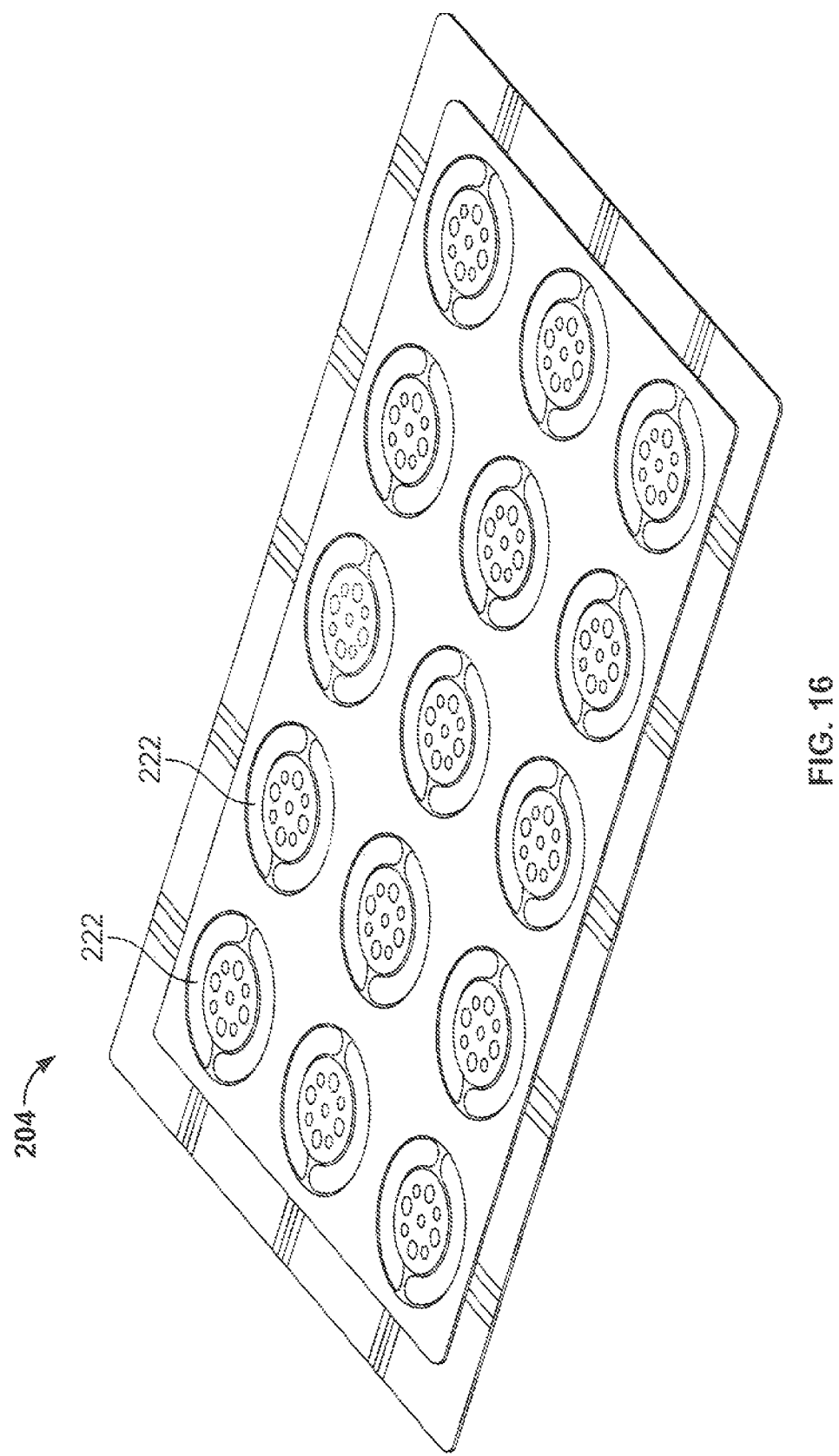
FIG. 16 is an assembled view of an array of actuators of the type illustrated in FIGS. 3A-3C.
Figure 17:
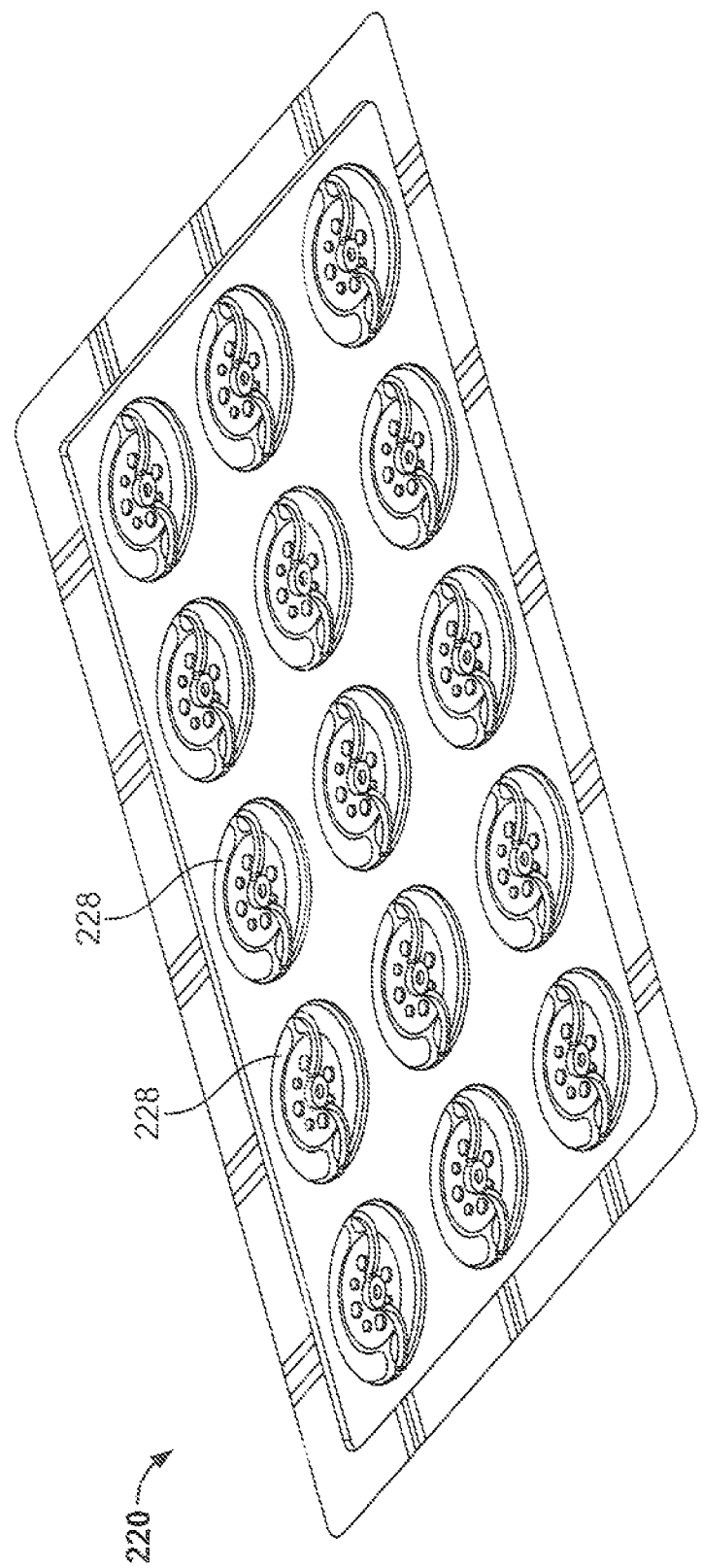
FIG. 17 is an assembled view of an array of actuators of the type illustrated in FIG. 8.

FIGS. 14A and 14B illustrate high voltage and ground sides 200a and 200b, respectively, of an EAP film array 200 (see FIG. 15) for use in an array of EAP actuators for use in the tactile feedback devices of the present invention. Film array 200 includes an electrode array provided in a matrix configuration to increase space and power efficiency. The high voltage side 200a of the EAP film array provides electrode patterns 202 running in vertically (according to the view point illustrated in FIG. 14A) on dielectric film 208 material. Each pattern 202 includes a pair of high voltage lines 202a, 202b. The opposite or ground side 200b of the EAP film array provides electrode patterns 206 running transversally relative to the high voltage electrodes, i.e., horizontally. Each pattern 206 includes a pair of ground lines 206a, 206b. Each pair of opposing high voltage and ground lines (202a, 206a and 202b, 206b) provides a separately activatable electrode pair such that activation of the opposing electrode pairs provides a two-phase output motion in the directions illustrated by arrows 212. The assembled EAP film array 200 (illustrating the intersecting pattern of electrodes on top and bottom sides of dielectric film 208) is provided in FIG. 15 within an exploded view of an array 204 of EAP transducers 222, the latter of which is illustrated in its assembled form in FIG. 16. EAP film array 200 is sandwiched between opposing frame arrays 214a, 214b, with each individual frame segment 216 within each of the two arrays defined by a centrally positioned output disc 218 within an open area. Each combination of frame/disc segments 216 and electrode configurations form an EAP transducer 222. Depending on the application and type of actuator desired, additional layers of components may be added to transducer array 204. For example, to form an array of the bi-stable EAP actuators of FIG. 8, an additional array layer 226 of negative spring rate flexures 224 is provided on one side of the transducer array 204. The complete transducer layer 220 having an array of EAP transducers 228 is illustrated in exploded and assembled views in FIGS. 15 and 17, respectively. The transducer array 220 may be incorporated in whole to a user interface array, such as a keyboard, for example, or the individual transducers 228 may be singulated for use in individual user interface devices, such as individual keypads, for example.

Regarding methodology, the subject methods may include each of the mechanical and/or activities associated with use of the devices described. As such, methodology implicit to the use of the devices described forms part of the invention. Other methods may focus on fabrication of such devices.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

In all, the breadth of the present invention is not to be limited by the examples provided. That being said, we claim:

The invention claimed is:

1. A method for fabricating electroactive polymer transducers, the method comprising:
   providing an electroactive polymer film comprising an elastomeric dielectric polymer having an elastic modulus of less than about 100 MPa;
   forming an array of electrodes on the electroactive polymer film;
   sandwiching the electrode array between a top and bottom array of frame components to form an array of electroactive polymer transducers; and
   applying an array of negative spring rate biasing mechanisms onto the array of electroactive polymer transducers,
   wherein the array of negative spring rate biasing mechanisms are configured to impose a negative spring rate bias on the electroactive polymer film, and
   wherein the negative spring rate biasing mechanisms comprise a central hub mechanically coupled to an output disc and two opposing leaf spring flexures extending between the central hub and a frame side of an electroactive polymer transducer.

2. The method of claim 1, further comprising singulating the array of electroactive polymer transducers.

3. The method of claim 2, further comprising incorporating at least one singulated electroactive polymer transducer into a user interface device.

4. The method of claim 1, further comprising incorporating the transducer array into an array of user interface devices.

5. The method of claim 1, wherein each of the transducers are fabricated with web-based manufacturing techniques.

6. The method of claim 1, further comprising sealing at least one electroactive polymer transducer of the array of electroactive polymer transducers.

7. The method of claim 1, wherein sealing the at least one electroactive polymer transducer comprises hermetically sealing the at least one electroactive polymer transducer.

8. The method of claim 1, further comprising applying at least one disc segment onto the array of electroactive polymer transducers.

9. The method of claim 1, further comprising applying at least one output member onto the array of electroactive polymer transducers.

10. The method of claim 9, further comprising mechanically coupling the at least one output member to at least one user contact surface.

11. The method of claim 9, further comprising magnetically coupling the at least one output member to at least one user contact surface.

12. The method of claim 1, wherein forming the array of electrodes on the film comprises applying a high voltage electrode pattern comprising high voltage lines and a ground side electrode pattern comprising ground lines.

13. The method of claim 12, wherein the high voltage lines comprise a pair of high voltage lines and the ground lines comprise a pair of ground lines corresponding to the pair of high voltage lines.

14. The method of claim 1, further comprising incorporating the array of electroactive polymer transducers into a user interface array.

15. The method of claim 14, wherein the user interface array is a keyboard.

16. The method of claim 1, further comprising applying at least one mechanical force sensor onto the array of electroactive polymer transducers.

17. The method of claim 1, further comprising pre-straining the electroactive polymer film by stretching the electroactive polymer film and holding the electroactive polymer film in a pre-strained condition.

18. The method of claim 1, wherein the array of negative spring rate biasing mechanisms are configured to impose the negative spring rate bias on a output component secured to the electroactive polymer film.

19. A method for fabricating electroactive polymer transducers, the method comprising:
   providing an electroactive polymer film comprising an elastomeric dielectric polymer having an elastic modulus of less than about 100 MPa, wherein the electroactive polymer film is a first electroactive polymer film;
forming an array of electrodes on the electroactive polymer film;
sandwiching the electrode array between a top and bottom array of frame components to form an array of electroactive polymer transducers;
applying at least one first magnetic unit to the first electroactive polymer film;
providing a second electroactive polymer film;
and applying at least one second magnetic unit to the second electroactive polymer film, and wherein the at least one first magnetic unit and the at least one second magnetic unit are oppositely polarized or similarly polarized.

* * * * *